United States Patent
Winkler et al.

(10) Patent No.: US 9,028,716 B2
(45) Date of Patent: May 12, 2015

(54) NITRIDOSILICATES CO-DOPED WITH ZIRCONIUM AND HAFNIUM

(75) Inventors: Holger Winkler, Darmstadt (DE); Ralf Petry, Griesheim (DE); Tim Vosgroene, Ober-Ramstadt (DE); Thomas Juestel, Witten (DE); Dominik Uhlich, Steinfurt (DE); Danuta Dutczak, Steinfurt (DE)

(73) Assignee: Merck Patent GmbH, Darmstadt (DE)

( * ) Notice: Subject to any disclaimer, the term of this patent is extended or adjusted under 35 U.S.C. 154(b) by 799 days.

(21) Appl. No.: 13/203,288

(22) PCT Filed: Feb. 1, 2010

(86) PCT No.: PCT/EP2010/000592
§ 371 (c)(1),
(2), (4) Date: Aug. 25, 2011

(87) PCT Pub. No.: WO2010/097157
PCT Pub. Date: Sep. 2, 2010

(65) Prior Publication Data
US 2011/0304261 A1    Dec. 15, 2011

(30) Foreign Application Priority Data
Feb. 27, 2009  (DE) .......................... 10 2009 010 705

(51) Int. Cl.
*C09K 11/08* (2006.01)
*C09K 11/54* (2006.01)
(Continued)

(52) U.S. Cl.
CPC ......... *C09K 11/7734* (2013.01); *C09K 11/7792* (2013.01); *C01B 21/06* (2013.01);
(Continued)

(58) Field of Classification Search
CPC .... C09K 11/02; C09K 11/77; C09K 11/7728; C09K 11/7731; C09K 11/7734; C09K 11/7774; C09K 11/7792
USPC ....... 252/301.4 F, 301.4 R, 301.6 R, 301.6 F; 313/467, 483, 503
See application file for complete search history.

(56) References Cited

U.S. PATENT DOCUMENTS

| 7,258,816 B2 | 8/2007 | Tamaki et al. |
| 7,297,293 B2 | 11/2007 | Tamaki et al. |

(Continued)

FOREIGN PATENT DOCUMENTS

| EP | 1 433 831 A1 | 6/2004 |
| EP | 1 630 877 A2 A2 | 3/2006 |

(Continued)

OTHER PUBLICATIONS

Li et al., "Luminescence properties of Ce3+-activated alkaline earth silicon nitride M2Si5N8 (M=Ca, Sr, Ba) materials", availabone online May 17, 2005, Journal of Luminescence, vol. 116, pp. 107-116.*

(Continued)

*Primary Examiner* — Carol M Koslow
*Assistant Examiner* — Lynne Edmondson
(74) *Attorney, Agent, or Firm* — Millen, White, Zelano & Branigan, P.C.

(57) ABSTRACT

The invention relates to compounds of the formula (I) $Ma_{2-y}(Ca,Sr,Ba)_{1-x-y}Si_{5-z}Me_zN_8:Eu_xCe_y$ (I), where Ma=Li, Na and/or K Me=$Hf^{4+}$ and/or $Zr^{4+}$ x=0.0015 to 0.20 and y=0 to 0.15 z<4, and to a process for the preparation of these compounds and to the use as phosphors and conversion phosphors for conversion of the blue or near-UV emission from an LED.

21 Claims, 14 Drawing Sheets

(51) Int. Cl.
   *C09K 11/77* (2006.01)
   *C01B 21/06* (2006.01)
   *C04B 35/584* (2006.01)
   *C04B 35/626* (2006.01)

(52) U.S. Cl.
   CPC ........ C04B 35/584 (2013.01); C04B 35/62675 (2013.01); C04B 2235/3201 (2013.01); C04B 2235/3203 (2013.01); C04B 2235/3208 (2013.01); C04B 2235/3213 (2013.01); C04B 2235/3215 (2013.01); C04B 2235/3224 (2013.01); C04B 2235/3229 (2013.01); C04B 2235/3244 (2013.01); C04B 2235/3852 (2013.01); C04B 2235/3873 (2013.01); C04B 2235/445 (2013.01); C04B 2235/6582 (2013.01); C01P 2002/72 (2013.01); C01B 21/062 (2013.01); C01P 2002/54 (2013.01); C01P 2002/84 (2013.01)

(56) References Cited

U.S. PATENT DOCUMENTS

| | | | |
|---|---|---|---|
| 7,511,411 | B2 | 3/2009 | Maruta et al. |
| 7,556,744 | B2 | 7/2009 | Tamaki et al. |
| 7,569,987 | B2 | 8/2009 | Naitou |
| 7,579,765 | B2 | 8/2009 | Takahara et al. |
| 7,597,823 | B2 | 10/2009 | Tamaki et al. |
| 7,964,113 | B2 | 6/2011 | Tamaki et al. |
| 2004/0135504 | A1 | 7/2004 | Tamaki et al. |
| 2005/0230689 | A1 | 10/2005 | Setlur et al. |
| 2006/0001352 | A1* | 1/2006 | Maruta et al. ............... 313/486 |
| 2006/0038477 | A1* | 2/2006 | Tamaki et al. ............... 313/485 |
| 2006/0043879 | A1* | 3/2006 | Naitou ........................ 313/501 |
| 2007/0040502 | A1 | 2/2007 | Setlur et al. |
| 2008/0089825 | A1 | 4/2008 | Tamaki et al. |
| 2008/0274029 | A1 | 11/2008 | Takahara et al. |
| 2009/0072708 | A1 | 3/2009 | Tamaki et al. |
| 2009/0230840 | A1 | 9/2009 | Tamaki et al. |
| 2009/0284132 | A1 | 11/2009 | Tamaki et al. |
| 2009/0309485 | A1 | 12/2009 | Tamaki et al. |
| 2010/0187976 | A1 | 7/2010 | Winkler |
| 2010/0201250 | A1 | 8/2010 | Winkler et al. |

FOREIGN PATENT DOCUMENTS

| | | |
|---|---|---|
| JP | 2004182780 A | 7/2004 |
| WO | 2008017353 A1 | 2/2008 |
| WO | 2008/122332 A1 | 10/2008 |

OTHER PUBLICATIONS

Xie, Rong-Jun, et al., "A Simple, Efficient Synthetic Route to SrSiN:Eu-Based Red Phosphors for White Light-Emitting Diodes," Chemistry of Materials, 2006, 18(23), pp. 5578-5583, Washington, DC.

Piao, X., et al., "Characterization and luminescence properties of $Sr_2Si_5N_8$:$Eu^{2+}$phosphor for white light-emitting-diode illumination," Applied Physics Letters 88, 161908 (2006), pp. 161908-1 to 161908-3.

Li, Y.Q., et al., "Luminescence properties of $Ce^{3+}$-activated alkaline earth silicon nitride $M_2Si_5N_8$ (M=Ca, Sr, Ba) materials," Journal of Luminescence, Jan. 1, 2006, vol. 116, No. 1-2, pp. 107-116, Amsterdam, NL; Cited in ISR, dated Apr. 15, 2010, issued in corresp PCT/EP2010/000592.

International Search Report, dated Apr. 15, 2010, issued in corresponding PCT/EP2010/000592.

Official Action related to corresponding Japanese Patent Application No. 2011-551427, dated Jun. 6, 2014.

* cited by examiner

NITRIDOSILICATES CO-DOPED WITH ZIRCONIUM AND HAFNIUM

The invention relates to compounds which consist of 2-5-8 alkaline-earth metal siliconitrides co-doped with $Hf^{4+}$, $Zr^{4+}$, $Li^+$, $Na^+$ and/or $K^+$ with Eu and/or Ce activation, to the preparation thereof, and to the use thereof as phosphors and LED conversion phosphors for warm-white LEDs or so-called colour-on-demand applications.

The colour-on-demand concept is taken to mean the achievement of light having a certain colour point by means of a pcLED (=phosphor converted LED) using one or more phosphors. This concept is used, for example, in order to produce certain corporate designs, for example for illuminated company logos, trademarks, etc.

Phosphor-converted LEDs represent an important light technology whose innovation potential is resulting in the increasing replacement of traditional artificial light sources (incandescent lamps, discharge lamps, etc.). Whereas semiconductor technology is virtually exhausted for LEDs, the phosphors employed offer room for improvement. LED manufacturers are repeatedly emphasising the necessity for red phosphors for (power) LEDs. The requisite properties of red phosphors for efficient and effective use in LEDs are, inter alia:

Emission bands in a wavelength range from 610-620 nm (general lighting with high CRI or high CCT), or 630 nm and 650 nm (backlighting for LC displays with a large colour space).

High fluorescence quenching temperatures ($TQ_{50}>>150°$ C.).

High chemical stability to acids and moisture.

High light yield, which results from high absorption in the spectral region of the emission band of the excitation LED, high extraction of emission light from the phosphor to the environment and high conversion efficiency (QE).

There is a number of phosphor material systems which fulfil some, but not all, of the above-mentioned conditions required by the LED manufacturer. However, only the fulfillment of all conditions will greatly accelerate the replacement of traditional electric light sources by LEDs and result in a reduction in the electrical energy required worldwide for lighting. Commercially available phosphor materials, which fluoresce in the red and can in principle be combined with blue (or UV) LEDs, are, in particular:

Orthosilicates:
The materials have high luminance and efficiency, but the longest emission wavelength is at about 610 nm.

Sulfides, Thiogallates and Sulfoselenides:
These phosphors are capable of emitting in the above-mentioned wavelength ranges. The greatest disadvantage of sulfur-containing materials is their instability to atmospheric oxygen and moisture. Both very easily enter the LED by diffusion through the silicone binder material to the phosphor and react therewith, during which it is degraded. In addition, only low degrees of doping are frequently possible, resulting in saturation phenomena at a high excitation density.

Nitrides and Oxynitrides:
Covalent nitrides can in principle be employed as matrix for phosphors since they have a large band gap, in which the HOMO and LUMO of activator ions are localised. Due to the high covalency, nitrides have a large nephelauxetic effect, as a result of which the energy of the lowest crystal-field component of the excited 4f5d configuration of rare-earth activators, for example $Eu^{2+}$, $Ce^{3+}$, is reduced. This results in long-wavelength excitation of and emission from nitride phosphors (see Krevel et al., J. Alloys Compd. 1998, 268, 272).

Siliconitrides, in particular, exhibit a close relationship with oxosilicon compounds, since both systems are built up from $SiX_4$ tetrahedra (X=O, N).

Owing to the higher degree of condensation, however, siliconitrides have higher chemical stability than oxosilicon compounds (see Xie et al., Sci. Tech. Adv. Mater. 2007, 8, 588).

In particular, siliconitrides are suitable for doping with activator ions, such as $Eu^{2+}$ and $Ce^{3+}$, in which at least one electron in the excited state is not screened by the action of the crystal field (5s and 5d). Such activators have spectroscopic properties which are highly dependent on the environment (symmetry, covalency, coordination, field strength, bond lengths, lattice site size). The high formal charge of nitrogen ($N^{3-}$) results, in contrast to the lower formal charge of oxygen ($O^{2-}$), in the above-mentioned activators experiencing greater crystal-field splitting of the 5d orbitals in siliconitrides and the energetic centre of the 5d orbitals being shifted to lower energy than is the case in analogous Si—O materials. The excitation and emission bands of the activator thus exhibit a spectral red shift. Furthermore, the more stable and more rigid lattice of the siliconitrides compared with that of the oxosilicon compounds results in the Stokes shift being reduced, as a result of which the thermal quenching only takes place at higher temperatures and the conversion efficiency is increased.

The first siliconitride phosphor system to be published was $CaSiN_2$:$Eu^{2+}$ (see Lim et al. SPIE Vol. 3241, 1997, Photoluminescence of $CaSiN_2$:Eu). This phosphor is suitable as converter for blue- and UV-emitting LEDs since it exhibits luminescence at about 630 nm on excitation in these wavelength ranges.

EP 1153101 and EP 1238041 describe so-called "2-5-8" siliconitrides having the composition $(Ca,Sr,Ba)_{2-x}Si_5N_8$:$Eu_x$. These phosphors can be excited from the near-UV to the blue spectral region and emit from orange to deep red, depending on the chemical composition.

The object of the present invention is therefore to modify the above-mentioned 2-5-8 alkaline-earth metal siliconitrides in such a way that these compounds achieve even higher light efficiency.

Surprisingly, it has been found that the requirement for an economically important further increase in the conversion efficiency of the $(Ca,Sr,Ba)_{2-x}Si_5N_8$:$Eu_x$ phosphors can be satisfied if co-doping with tetravalent and/or monovalent cations is carried out.

The present invention thus relates to compounds of the 2-5-8 alkaline-earth metal siliconitride type with europium and/or cerium doping which additionally comprise hafnium, zirconium, lithium, sodium and/or potassium as co-dopants.

"2-5-8 alkaline-earth metal siliconitrides" (also known as "2-5-8 nitrides" or "2-5-8 alkaline-earth metal nitridosilicates") are taken to mean compositions $M_2Si_5N_8$:$Eu^{2+}$, where M represents an alkaline-earth metal or a mixture of a plurality of alkaline-earth metals.

Preference is given to compounds of the formula I $$Ma_{2-y}(Ca,Sr,Ba)_{1-x-y}Si_{5-z}Me_zN_8:Eu_xCe_y \qquad (I)$$

where
Ma=Li, Na and/or K
Me=$Hf^{4+}$ and/or $Zr^{4+}$
x=0.0015 to 0.20
y=0 to 0.15
and z<4.

It is preferred if the z value (which stands for the atom concentration of the co-dopants Me) is <1, more preferably <0.1, most preferably 0.0002 to 0.02.

It is preferred if x=0.005 to 0.19 and y=0 to 0.08.

The greater luminance of the compounds or phosphors of the formula I according to the invention compared with those of identical composition, but without the co-dopants Hf and/or Zr, can be explained by means of theories known to the person skilled in the art by these ions having an influence on the lifetime of the excited states of the activator ions: excited electrons of such phosphors return to the ground state after a relatively short time with emission of fluorescence light, i.e. these electrons can carry out more excitation and relaxation processes in the same time interval (see S. Shionoya, W. M. Yen, Phosphor Handbook, CRC Press, New York, 1999, ISBN 0-8493-7560-6).

It is known to the person skilled in the art that co-activation of $Eu^{2+}$ phosphors using $Ce^{3+}$ can result in favourable properties of the $Eu^{2+}$ phosphor, enabling the phosphor to be made more efficient or stable.

Furthermore, these co-dopants can have an efficiency-increasing effect in that they are able to bind undesired oxygen present in the siliconitride (which results in a reduction in luminance or efficiency and a shift of the colour points).

The particle size of the compounds according to the invention is between 50 nm and 30 μm, preferably between 1 μm and 20 μm, more preferably between 2 and 15 μm.

Monovalent ions, such as Li, Na and/or K, and halides, such as F or Cl, can preferably be incorporated into the crystal lattice of the compounds according to the invention. These monovalent ions are preferably employed as fluxing agents during phosphor preparation and serve for increasing the crystal quality, roughly setting the particle size and the particle morphology and thus have high potential for increasing the efficiency of the phosphors. This procedure is known to the person skilled in the art (see, for example, H. S. Kang et al. Mater. Science and Engineering B 121(2005) 81-85).

Furthermore, oxygen and carbon may be present in the crystal lattice of the 2-5-8 nitrides according to the invention in a content of <0.2 at-%. It is known that these substances are suitable as constituents of the nitrides through the use of fluxing agents or from the starting materials (see Hintzen et al, Chem. Mater. 2005, 17, 3242-48 "Synthese von $Me_2Si_5N_8$:Eu aus Me-Carbonaten" [Synthesis of $Me_2Si_5N_8$: Eu from Me carbonates] or X. Piao et al, Applied Physis Lett. 88, 161908 (2006) "*Characterisation and luminescence properties of $Sr_2Si_5N_8$:$Eu^{2+}$ phosphor for white light-emitting-diode illumination*" or R. Xie et al. Chem. Mater. 2006, 18 (23), 5578-5583 "*A simple, efficient synthetic route to SrSiN:Eu-based red phosphors for white LED*")

It is also conceivable for the 2-5-8 nitrides to be co-doped with Mn, Mg, Be, Ni, Co, Th and/or Ru, where F, O or C may additionally be incorporated into the crystal lattice here.

The present invention furthermore relates to a compound obtainable by mixing silicon nitride-, europium-, cerium- and calcium- and/or strontium- and/or barium-containing starting materials with at least one hafnium-, zirconium-, lithium-, sodium- and/or potassium-containing co-dopant by solid-state diffusion methods with subsequent thermal aftertreatment.

The present invention furthermore relates to a process for the preparation of a compound of the 2-5-8 alkaline-earth metal siliconitride type with europium and/or cerium doping having the following process steps:
preparation of an Eu- and/or Ce-doped 2-5-8 alkaline-earth metal siliconitride compound co-doped with hafnium-, zirconium-, lithium-, sodium- and/or potassium-containing materials by mixing at least 4 starting materials selected from silicon nitride-, europium-, cerium-, calcium-, strontium-, barium-, hafnium-, zirconium-, lithium-, sodium-, potassium-containing materials,
thermal aftertreatment of the compound co-doped with Hf and/or Zr.

The starting materials for the preparation of the compound consist, as mentioned above, of silicon nitride ($Si_3N_4$), calcium hydride, europium fluoride and/or cerium fluoride and at least one Hf-, Zr-, Li-, Na- and/or K-containing co-dopant. Besides the preferred nitrides, hydrides and fluorides, suitable starting materials are also further inorganic and/or organic substances, such as cyanamides, dicyanamides, cyanides, oxalates, malonates, fumarates, carbonates, citrates, ascorbates and acetylacetonates.

The thermal aftertreatment mentioned above (see process step b) takes a number of hours under reducing conditions, for example with forming gas (for example 90/10), pure hydrogen and/or in an ammonia atmosphere and/or nitrogen or mixtures of methane and nitrogen with or without the atmospheres mentioned above, where this treatment can also be carried out at superatmospheric pressures. The temperatures during the calcination process are between 1000° C. and 1800° C., preferably from 1200° C. to 1650° C.

With the aid of the processes mentioned above, it is possible to produce any desired outer shapes of the compounds or phosphors according to the invention, such as spherical particles, flakes and structured materials and ceramics. These shapes are summarised in accordance with the invention under the term "shaped body". The shaped body is preferably a "phosphor element".

The present invention thus furthermore relates to a shaped body comprising the compounds according to the invention, which has a rough surface which carries nanoparticles comprising $SiO_2$, $TiO_2$, $Al_2O_3$, ZnO, $ZrO_2$ and/or $Y_2O_3$ or mixed oxides thereof and/or particles comprising the compound according to the invention with or without dopants from the series europium, cerium, hafnium, zirconium, lithium, sodium and/or potassium.

In a further preferred embodiment, the shaped body has a structured (for example pyramidal) surface on the side opposite an LED chip (see WO 2008/058619, Merck, which is incorporated in its full scope into the context of the present application by way of reference). This enables as much light as possible to be coupled out of the phosphor.

The structured surface on the shaped body is produced by subsequent coating with a suitable material, which is already structured, or in a subsequent step by (photo)lithographic processes, etching processes or by writing processes using energy beams or material jets or the action of mechanical forces.

In a further preferred embodiment, the shaped bodies according to the invention have, on the side opposite an LED chip, a rough surface which carries nanoparticles comprising $SiO_2$, $TiO_2$, $Al_2O_3$, $ZnO_2$, $ZrO_2$ and/or $Y_2O_3$, or combinations of these materials, and/or particles having the phosphor composition of the formula I with or without dopants from the series Mn, Mg, Be, Ni, Co, Th and/or Ru. A rough surface here has a roughness of up to a few 100 nm. The coated surface has the advantage that total internal reflection can be reduced or prevented and the light can be coupled out of the phosphor according to the invention better (see WO 2008/058619 (Merck), which is incorporated in its full scope into the context of the present application by way of reference).

It is furthermore preferred for the shaped bodies according to the invention to have, on the surface facing away from the chip, a layer of matched refractive index which simplifies coupling-out of the primary radiation and/or of the radiation emitted by the phosphor element.

In a further preferred embodiment, the shaped bodies have a continuous surface coating which consists of $SiO_2$, $TiO_2$, $Al_2O_3$, ZnO, $ZrO_2$ and/or $Y_2O_3$ or mixed oxides thereof and/or of the compounds of the formula I without the activator europium and/or cerium. This surface coating has the advantage that a suitable graduation of the refractive index of the coating materials enables the refractive index to be matched to the environment. In this case, the scattering of the light at the surface of the phosphor is reduced and a greater proportion of the light can penetrate into the phosphor and be absorbed and converted there. In addition, the surface coating of matched refractive index enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed sheath is thermal decoupling of the actual phosphor from the heat arising in the chip. This heat results in a reduction in the fluorescence light yield of the phosphor and may also influence the colour of the fluorescence light. Finally, a coating of this type makes it possible to increase the efficiency of the phosphor by preventing lattice vibrations arising in the phosphor from propagating into the environment.

In addition, it is preferred for the shaped body to have a porous surface coating which consists of $SiO_2$, $TiO_2$, $Al_2O_3$, ZnO, $ZrO_2$ and/or $Y_2O_3$ or mixed oxides thereof and/or of the compounds of the formula I with or without dopants from the series Eu, Ce, Hf, Zr, Li, Na and/or K. These porous coatings offer the possibility of further reducing the refractive index of a single layer. Porous coatings of this type can be produced by three conventional methods, as described in WO 03/027015, which is incorporated in its full scope into the context of the present application by way of reference: etching of glass (for example soda-lime glasses (see U.S. Pat. No. 4,019,884)), application of a porous layer, and combination of a porous layer and an etching process.

In a further preferred embodiment, the shaped body has a surface which carries functional groups which facilitate chemical or physical bonding to the environment, preferably consisting of epoxy or silicone resin. These functional groups can be esters or other derivatives bonded, for example, via oxo groups which are able to form links to constituents of the binders based on epoxides and/or silicones. Surfaces of this type have the advantage that homogeneous mixing of the phosphors into the binder is facilitated. Furthermore, the rheological properties of the phosphor/binder system and also the pot lives can thus be adjusted to a certain extent. Processing of the mixtures is thus simplified. Physical bonding to the environment in this connection is taken to mean electrostatic interactions between the systems via charge fluctuations or partial charges.

Since the phosphor layer according to the invention applied to the LED chip preferably consists of a mixture of silicone and homogeneous phosphor particles, and the silicone has a surface tension, this phosphor layer is non-uniform at a microscopic level or the thickness of the layer is not constant throughout.

As a further preferred embodiment, flake-form phosphors are prepared by conventional processes from the corresponding metal and/or rare-earth salts. The preparation process is described in detail in EP 763573 and WO 2008/058620, which are incorporated in their full scope into the context of the present application by way of reference. These flake-form phosphors can be prepared by coating a natural or synthetically produced, highly stable support or a substrate comprising, for example, mica flakes, $SiO_2$ flakes, $Al_2O_3$ flakes, $ZrO_2$ flakes, glass flakes or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from a material. If the flake itself serves merely as support for the phosphor coating, the latter must consist of a material which is transparent to the primary radiation from the LED, or absorbs the primary radiation and transmits this energy to the phosphor layer. The flake-form phosphors are dispersed in a resin (for example silicone or epoxy resin), and this dispersion is applied to the LED chip.

The flake-form phosphors can be prepared on a large industrial scale in thicknesses of 50 nm to about 20 μm, preferably between 150 nm and 5 μm. The diameter here is from 50 nm to 20 μm.

They generally have an aspect ratio (ratio of the diameter to the particle thickness) from 1:1 to 400:1 and in particular 3:1 to 100:1.

The flake size (length×width) is dependent on the arrangement. Flakes are also suitable as centres of scattering within the conversion layer, in particular if they have particularly small dimensions.

The surface of the flake-form phosphor according to the invention facing the LED chip can be provided with a coating which has a reflection-reducing action in relation to the primary radiation emitted by the LED chip. This results in a reduction in back-scattering of the primary radiation, enhancing coupling of the latter into the phosphor element according to the invention. Suitable for this purpose are, for example, refractive-index-matched coatings, which must have a following thickness d: d=[wavelength of the primary radiation from the LED chip/(4*refractive index of the phosphor ceramic)], see, for example, Gerthsen, Physik [Physics], Springer Verlag, 18th Edition, 1995. This coating may also consist of photonic crystals, which also encompasses structuring of the surface of the flake-form phosphor in order to achieve certain functionalities.

The production of the shaped bodies according to the invention in the form of ceramic elements is carried out analogously to the process described in WO 2008/017353 (Merck), which is incorporated in its full scope into the context of the present application by way of reference. The phosphor here is prepared by mixing the corresponding starting materials and dopants, subsequently pressing the mixture isostatically and applying the mixture in the form of a homogeneous, thin and non-porous flake directly to the surface of the chip or at a distance from the chip (remote phosphor concept). The respective arrangement depends, inter alia, on the architecture of the LED device, the person skilled in the art being capable of selecting the advantageous arrangement. No location-dependent variation of the excitation of and emission from the phosphor thus takes place, causing the LED provided therewith to emit a homogeneous light cone of constant colour and to have high luminous power. The ceramic phosphor elements can be produced on a large industrial scale, for example, as flakes in thicknesses from a few 100 nm to about 500 μm. The flake size (length×width) is dependent on the arrangement. In the case of direct application to the chip, the size of the flake should be selected in accordance with the chip size (from about 100 μm*100 μm to several $mm^2$) with a certain excess size of about 10%-30% of the chip surface in the case of a suitable chip arrangement (for example flip-chip arrangement) or correspondingly. If the phosphor flake is installed on top of a finished LED, all of the emitted light cone will hit the flake.

The side surfaces of the ceramic phosphor element can be metallised with a light or noble metal, preferably aluminium or silver. The metallisation has the effect that light does not exit laterally from the phosphor element. Light exiting laterally can reduce the light flux to be coupled out of the LED. The metallisation of the ceramic phosphor element is carried out in a process step after isostatic pressing to give rods or flakes, where, if desired, the rods or flakes can be cut to the necessary size before the metallisation. To this end, the side surfaces are wetted, for example with a solution of silver nitrate and glucose, and subsequently exposed to an ammonia atmosphere at elevated temperature. During this operation, a silver coating, for example, forms on the side surfaces.

Alternatively, electroless metallisation processes are suitable, see, for example, Hollemann-Wiberg, Lehrbuch der Anorganischen Chemie [Textbook of Inorganic Chemistry], Walter de Gruyter Verlag, or Ullmanns Enzyklopädie der chemischen Technologie [Ullmann's Encyclopaedia of Chemical Technology].

The ceramic phosphor element can, if necessary, be fixed to the substrate of an LED chip using a water-glass solution.

In a further embodiment, the ceramic phosphor element has a structured (for example pyramidal) surface on the side opposite an LED chip. This enables as much light as possible to be coupled out of the phosphor element. The structured surface on the phosphor element is produced by carrying out the isostatic pressing using a mould having a structured press plate and thus embossing a structure into the surface. Structured surfaces are desired if the aim is to produce the thinnest possible phosphor elements or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are $2/3$ to $5/6$ of the melting point of the substance to be pressed.

The present invention furthermore relates to a process for the production of a shaped body, preferably a phosphor element, having the following process steps:

a) preparation of a europium-doped 2-5-8 alkaline-earth metal siliconitride compound co-doped with hafnium- and/or zirconium-containing materials by mixing at least 4 starting materials selected from silicon nitride-, europium-, cerium-, calcium-, strontium-, barium-, hafnium-, zirconium-, lithium-, sodium- and/or potassium-containing materials, b) thermal aftertreatment of the co-doped compound and formation of a shaped body having a rough surface, c) coating of the rough surface with nanoparticles comprising $SiO_2$, $TiO_2$, $Al_2O_3$, ZnO, $ZrO_2$ and/or $Y_2O_3$ or mixed oxides thereof or with nanoparticles comprising the compounds according to the invention.

In addition, the phosphors according to the invention can be excited over a broad range, which extends from about 250 nm to 530 nm, preferably 430 nm to about 500 nm. These phosphors are thus not only suitable for excitation by UV or blue-emitting primary light sources, such as LEDs, or conventional discharge lamps (for example based on Hg), but also for light sources like those which utilise the blue $In^{3+}$ line at 451 nm.

The present invention furthermore relates to a lighting unit having at least one primary light source whose emission maximum or maxima is or are in the range 250 nm to 530 nm, preferably 430 nm to about 500 nm. Particular preference is given to a range between 440 and 480 nm, where the primary radiation is partially or completely converted into longer-wavelength radiation by the compounds or phosphors according to the invention. This lighting unit preferably emits white light or emits light having a certain colour point (colour-on-demand principle). Preferred embodiments of the lighting units according to the invention are depicted in FIGS. 9 to 20.

In a preferred embodiment of the lighting unit according to the invention, the light source is a luminescent indium aluminium gallium nitride, in particular of the formula $In_iGa_jAl_kN$, where $0 \leq i$, $0 \leq j$, $0 \leq k$, and $i+j+k=1$. Possible forms of light sources of this type are known to the person skilled in the art. They can be light-emitting LED chips having various structures.

In a further preferred embodiment of the lighting unit according to the invention, the light source is a luminescent arrangement based on ZnO, TCO (transparent conducting oxide), ZnSe or SiC or an organically light-emitting arrangement (OLED).

In a further preferred embodiment of the lighting unit according to the invention, the light source is a source which exhibits electroluminescence and/or photoluminescence. The light source may furthermore also be a plasma or discharge source.

The phosphors according to the invention can either be dispersed in a resin (for example epoxy or silicone resin) or, given suitable size ratios, arranged directly on the primary light source or, depending on the application, arranged remote therefrom (the latter arrangement also includes "remote phosphor technology"), or arranged both directly on the primary light source and remote therefrom. The advantages of remote phosphor technology are known to the person skilled in the art and are revealed, for example, in the following publication: Japanese Journ. of Appl. Phys. Vol. 44, No. 21 (2005). L649-L651.

In a further embodiment, it is preferred for the optical coupling of the lighting unit between the phosphor and the primary light source to be achieved by means of a light-conducting arrangement. This enables the primary light source to be installed at a central location and to be optically coupled to the phosphor by means of light-conducting devices, such as, for example, light-conducting fibres. In this way, lamps matched to the lighting wishes and merely consisting of one or different phosphors, which may be arranged to form a light screen, and a light conductor, which is coupled to the primary light source, can be achieved. In this way, it is possible to position a strong primary light source at a location which is favourable for the electrical installation and to install lamps comprising phosphors which are coupled to the light conductors at any desired locations without further electrical cabling, but instead only by running light conductors.

The present invention furthermore relates to the use of the compounds and shaped bodies according to the invention as phosphor or phosphor element.

The present invention furthermore relates to the use of the compounds according to the invention for partial or complete conversion of the blue or near-UV emission from a luminescent diode.

The compounds according to the invention are furthermore preferably used for conversion of the blue or near-UV emission into visible white radiation. The compounds according to the invention are furthermore preferably used for conversion of the primary radiation into a certain colour point in accordance with the "colour-on-demand" concept.

The compounds of the formula I according to the invention can be employed individually or as a mixture with the following phosphors which are familiar to the person skilled in the art:

Ba$_2$SiO$_4$:Eu$^{2+}$, BaSi$_2$O$_5$:Pb$^{2+}$, Ba$_x$Sri$_{1-x}$F$_2$:Eu$^{2+}$, BaSrMgSi$_2$O$_7$:Eu$^{2+}$, BaTiP$_2$O$_7$, (Ba,Ti)$_2$P$_2$O$_7$:Ti, Ba$_3$WO$_6$: U, BaY$_2$F$_8$Er$^{3+}$, Yb$^+$, Be$_2$SiO$_4$:Mn$^{2+}$, Bi$_4$Ge$_3$O$_{12}$, CaAl$_2$O$_4$: Ce$^{3+}$, CaLa$_4$O$_7$:Ce$^{3+}$, CaAl$_2$O$_4$:Eu$^{2+}$, CaAl$_2$O$_4$:Mn$^{2+}$, CaAl$_4$O$_7$:Pb$^{2+}$, Mn$^{2+}$, CaAl$_2$O$_4$:Tb$^{3+}$, Ca$_3$Al$_2$Si$_3$O$_{12}$:Ce$^{3+}$, Ca$_3$Al$_2$Si$_3$Oi$_2$:Ce$^{3+}$, Ca$_3$Al$_2$Si$_3$O$_2$:Eu$^{2+}$, Ca$_2$B$_5$O$_9$Br:Eu$^{2+}$, Ca$_2$B$_5$O$_9$Cl:Eu$^{2+}$, Ca$_2$B$_5$O$_9$Cl:Pb$^{2+}$, CaB$_2$O$_4$:Mn$^{2+}$, Ca$_2$B$_2$O$_5$:Mn$^{2+}$, CaB$_2$O$_4$:Pb$^{2+}$, CaB$_2$P$_2$O$_9$:Eu$^{2+}$, Ca$_5$B$_2$SiO$_{10}$:Eu$^{3+}$, Ca$_{0.5}$Ba$_{0.5}$Al$_{12}$O$_{19}$:Ce$^{3+}$, Mn$^{2+}$, Ca$_2$Ba$_3$(PO4)$_3$Cl:Eu$^{2+}$, CaBr$_2$:Eu$^{2+}$ in SiO$_2$, CaCl$_2$:Eu$^{2+}$ in SiO$_2$, CaCl$_2$:Eu$^{2+}$, Mn$^{2+}$ in SiO$_2$, CaF$_2$:Ce$^{3+}$, CaF$_2$:Ce$^{3+}$, Mn$^{2+}$, CaF$_2$:Ce$^{3+}$, Tb$^{3+}$, CaF$_2$:Eu$^{2+}$, CaF$_2$:Mn$^{2+}$, CaF$_2$:U, CaGa$_2$O$_4$:Mn$^{2+}$, CaGa$_4$O$_7$:Mn$^{2+}$, CaGa$_2$S$_4$:Ce$^{3+}$, CaGa$_2$S$_4$: Eu$^{2+}$, CaGa$_2$S$_4$:Mn$^{2+}$, CaGa$_2$S$_4$:Pb$^{2+}$, CaGeO$_3$:Mn$^{2+}$, CaI$_2$: Eu$^{2+}$ in SiO$_2$, CaI$_2$:Eu$^{2+}$, Mn$^{2+}$ in SiO$_2$, CaLaBO$_4$:Eu$^{3+}$, CaLaB$_3$O$_7$:Ce$^{3+}$, Mn$^{2+}$, Ca$_2$La$_2$BO$_{6.5}$:Pb$^{2+}$, Ca$_2$MgSi$_2$O$_7$, Ca$_2$MgSi$_2$O$_7$:Ce$^{3+}$, CaMgSi$_2$O$_6$:Eu$^{2+}$, Ca$_3$MgSi$_2$O$_8$:Eu$^{2+}$, Ca$_2$MgSi$_2$O$_7$:Eu$^{2+}$, CaMgSi$_2$O$_6$:Eu$^{2+}$, Mn$^{2+}$, Ca$_2$MgSi$_2$O$_7$: Eu$^{2+}$, Mn$^{2+}$, CaMoO$_4$, CaMoO$_4$:Eu$^{3+}$, CaO:Bi$^{3+}$, CaO:Cd$^{2+}$, CaO:Cu$^+$, CaO:Eu$^{3+}$, CaO:Eu$^{3+}$, Na$^+$, CaO:Mn$^{2+}$, CaO:Pb$^{2+}$, CaO:Sb$^{3+}$, CaO:Sm$^{3+}$, CaO:Tb$^{3+}$, CaO:Tl, CaO:Zn$^{2+}$, Ca$_2$P$_2$O$_7$:Ce$^{3+}$, α-Ca$_3$(PO$_4$)$_2$:Ce$^{3+}$, β-Ca$_3$(PO$_4$)$_2$:Ce$^{3+}$, Ca$_5$(PO$_4$)$_3$Cl:Eu$^{2+}$, Ca$_5$(PO$_4$)$_3$Cl:Mn$^{2+}$, Ca$_5$(PO$_4$)$_3$Cl:Sb$^{3+}$, Ca$_5$(PO$_4$)$_3$Cl:Sn$^{2+}$, β-Ca$_3$(PO$_4$)$_2$:Eu$^{2+}$, Mn$^{2+}$, Ca$_5$(PO$_4$)$_3$F: Mn$^{2+}$, Ca$_5$(PO$_4$)$_3$F:Sb$^{3+}$, Ca$_5$(PO$_4$)$_3$F:Sn$^{2+}$, α-Ca$_3$(PO$_4$)$_2$: Eu$^{2+}$, β-Ca$_3$(PO$_4$)$_2$:Eu$^{2+}$, Ca$_2$P$_2$O$_7$:Eu$^{2+}$, Ca$_2$P$_2$O$_7$:Eu$^{2+}$, Mn$^{2+}$, CaP$_2$O$_6$:Mn$^{2+}$, α-Ca$_3$(PO$_4$)$_2$:Pb$^{2+}$, α-Ca$_3$(PO$_4$)$_2$:Sn$^{2+}$, β-Ca$_3$(PO$_4$)$_2$:Sn$^{2+}$, β-Ca$_2$P$_2$O$_7$:Sn, Mn, α-Ca$_3$(PO$_4$)$_2$:Tr, CaS:Bi$^{3+}$, CaS:Bi$^{3+}$, Na, CaS:Ce$^{3+}$, CaS:Eu$^{2+}$, CaS:Cu$^+$, Na$^+$, CaS:La$^{3+}$, CaS:Mn$^{2+}$, CaSO$_4$:Bi, CaSO$_4$:Ce$^{3+}$, CaSO$_4$: Ce$^{3+}$, Mn$^{2+}$, CaSO$_4$:Eu$^{2+}$, CaSO$_4$:Eu$^{2+}$, Mn$^{2+}$, CaSO$_4$:Pb$^{2+}$, CaS:Pb$^{2+}$, CaS:Pb$^{2+}$, Cl, CaS:Pb$^{2+}$, Mn$^{2+}$, CaS:Pr$^{3+}$, Pb$^{2+}$, Cl, CaS:Sb$^{3+}$, CaS:Sb$^{3+}$,Na, CaS:Sm$^{3+}$, CaS:Sn$^{2+}$, CaS:Sn$^{2+}$, F, CaS:Tb$^{3+}$, CaS:Tb$^{3+}$, Cl, CaS:Y$^{3+}$, CaS:Yb$^{2+}$, CaS:Yb$^{2+}$, Cl, CaSiO$_3$:Ce$^{3+}$, Ca$_3$SiO$_4$O$_2$:Eu$^{2+}$, Ca$_3$SiO$_4$Cl$_2$:Pb$^{2+}$, CaSiO$_3$:Eu$^{2+}$, CaSiO$_3$:Mn$^{2+}$, Pb, CaSiO$_3$:Pb$^{2+}$, CaSiO$_3$: Pb$^{2+}$, Mn$^{2+}$, CaSiO$_3$:Ti$^{4+}$, CaSr$_2$(PO$_4$)$_2$:Bi$^{3+}$, β-(Ca,Sr)$_3$ (PO$_4$)$_2$:Sn$^{2+}$Mn$^{2+}$, CaTi$_{0.9}$Al$_{0.1}$O$_3$:Bi$^{3+}$, CaTiO$_3$:Eu$^{3+}$, CaTiO$_3$Pr$^{3+}$, Ca$_5$(VO$_4$)$_3$Cl, CaWO$_4$, CaWO$_4$:Pb$^{2+}$, CaWO$_4$: W, Ca$_3$WO$_6$:U, CaYAlO$_4$:Eu$^{3+}$, CaYBO$_4$:Bi$^{3+}$, CaYBO$_4$: Eu$^{3+}$, CaYB$_{0.8}$O$_{3.7}$:Eu$^{3+}$, CaY$_2$ZrO$_6$:Eu$^{3+}$, (Ca,Zn,Mg)$_3$ (PO$_4$)$_2$:Sn, CeF$_3$, (Ce,Mg)BaAl$_{11}$O$_{18}$:Ce, (Ce,Mg) SrAl$_{11}$O$_{18}$:Ce, CeMgAl$_{11}$O$_{19}$:Ce:Tb, Cd$_2$B$_6$O$_{11}$:Mn$^{2+}$, CdS: Ag$^+$, Cr, CdS:In, CdS:In, CdS:In, Te, CdS:Te, CdWO$_4$, CsF, CsI, CsI:Na$^+$, CsI:Tl, (ErCl$_3$)$_{0.25}$(BaCl$_2$)$_{0.75}$, GaN:Zn, Gd$_3$Ga$_5$O$_{12}$:Cr$^{3+}$, Gd$_3$Ga$_5$O$_{12}$:Cr, Ce, GdNbO$_4$:Bi$^{3+}$, Gd$_2$O$_2$S:Eu$^{3+}$, Gd$_2$O$_2$Pr$^{3+}$, Gd$_2$O$_2$S:Pr, Ce, F, Gd$_2$O$_2$S:Tb$^{3+}$, Gd$_2$SiO$_5$:Ce$^{3+}$, KAl$_{11}$O$_{17}$:Tl$^+$, KGa$_{11}$O$_{17}$:Mn$^{2+}$, K$_2$La$_2$Ti$_3$O$_{10}$:Eu, KMgF$_3$:Eu$^{2+}$, KMgF$_3$:Mn$^{2+}$, K$_2$SiF$_6$: Mn$^{4+}$, LaAl$_3$B$_4$O$_{12}$:Eu$^{3+}$, LaAlB$_2$O$_6$:Eu$^{3+}$, LaAlO$_3$:Eu$^{3+}$, LaAlO$_3$:Sm$^{3+}$, LaAsO$_4$:Eu$^{3+}$, LaBr$_3$:Ce$^{3+}$, LaBO$_3$:Eu$^{3+}$, (La, Ce,Tb)PO$_4$:Ce:Tb, LaCl$_3$:Ce$^{3+}$, La$_2$O$_3$:Bi$^{3+}$, LaOBr:Tb$^{3+}$, LaOBr:Tm$^{3+}$, LaOCl:Bi$^{3+}$, LaOCl:Eu$^{3+}$, LaOF:Eu$^{3+}$, La$_2$O$_3$: Eu$^{3+}$, La$_2$O$_3$:Pr$^{3+}$, La$_2$O$_2$S:Tb$^{3+}$, LaPO$_4$:Ce$^{3+}$, LaPO$_4$:Eu$^{3+}$, LaSiO$_3$Cl:Ce$^{3+}$, LaSiO$_3$Cl:Ce$^{3+}$, Tb$^{3+}$, LaVO$_4$:Eu$^{3+}$, La$_2$W$_3$O$_{12}$:Eu$^{3+}$, LiAlF$_4$:Mn$^{2+}$, LiAl$_5$O$_8$:Fe$^{3+}$, LiAlO$_2$:Fe$^{3+}$, LiAlO$_2$:Mn$^{2+}$, LiAl$_5$O$_8$:Mn$^{2+}$, Li$_2$CaP$_2$O$_7$:Ce$^{3+}$, Mn$^{2+}$, LiCeBa$_4$Si$_4$O$_{14}$:Mn$^{2+}$, LiCeSrBa$_3$Si$_4$O$_{14}$:Mn$^{2+}$, LiInO$_2$: Eu$^{3+}$, LiInO$_2$:Sm$^{3+}$, LiLaO$_2$:Eu$^{3+}$, LuAlO$_3$:Ce$^{3+}$, (Lu,Gd)$_2$ SiO$_5$:Ce$^{3+}$, Lu$_2$SiO$_5$:Ce$^{3+}$, Lu$_2$Si$_2$O$_7$:Ce$^{3+}$, LuTaO$_4$:Nb$^{5+}$, Lu$_{1-x}$Y$_x$AlO$_3$:Ce$^{3+}$, MgAl$_2$O$_4$:Mn$^{2+}$, MgSrAl$_{10}$O$_{17}$:Ce, MgB$_2$O$_4$:Mn$^{2+}$, MgBa$_2$(PO$_4$)$_2$:Sn$^{2+}$, MgBa$_2$(PO$_4$)$_2$:U, MgBaP$_2$O$_7$:Eu$^{2+}$, MgBaP$_2$O$_7$:Eu$^{2+}$, Mn$^{2+}$, MgBa$_3$Si$_2$O$_8$: Eu$^{2+}$, MgBa(SO$_4$)$_2$:Eu$^{2+}$, Mg$_3$Ca$_3$(PO$_4$)$_4$:Eu$^{2+}$, MgCaP$_2$O$_7$: Mn$^{2+}$, Mg$_2$Ca(SO$_4$)$_3$:Eu$^{2+}$, Mg$_2$Ca(SO$_4$)$_3$:Eu$^{2+}$, Mn$^2$, MgCeAl$_n$O$_{19}$:Tb$^{3+}$, Mg$_4$(F)GeO$_6$:Mn$^{2+}$, Mg$_4$(F)(Ge,Sn)O$_6$: Mn$^{2+}$, MgF$_2$:Mn$^{2+}$, MgGa$_2$O$_4$:Mn$^{2+}$, Mg$_8$Ge$_2$O$_{11}$F$_2$:Mn$^{4+}$, MgS:Eu$^{2+}$, MgSiO$_3$:Mn$^{2+}$, Mg$_2$SiO$_4$:Mn$^{2+}$, Mg$_3$SiO$_3$F$_4$: Ti$^{4+}$, MgSO$_4$:Eu$^{2+}$, MgSO$_4$:Pb$^{2+}$, MgSrBa$_2$Si$_2$O$_7$:Eu$^{2+}$, MgSrP$_2$O$_7$:Eu$^{2+}$, MgSr$_5$(PO$_4$)$_4$:Sn$^{2+}$, MgSr$_3$Si$_2$O$_8$:Eu$^{2+}$, Mn$^{2+}$, Mg$_2$Sr(SO$_4$)$_3$:Eu$^{2+}$, Mg$_2$TiO$_4$:Mn$^{4+}$, MgWO$_4$, MgYBO$_4$:Eu$^{3+}$, Na$_3$Ce(PO$_4$)$_2$:Tb$^{3+}$, NaI:Tl, Na$_{1.23}$K$_{0.42}$Eu$_{0.12}$TiSi$_4$O$_{11}$:Eu$^{3+}$, Na$_{1.23}$K$_{0.42}$Eu$_{0.12}$TiSi$_5$O$_{13}$.xH$_2$O:Eu$^{3+}$, Na$_{1.29}$K$_{0.46}$Er$_{0.08}$TiSi$_4$O$_{11}$:Eu$^{3+}$, Na$_2$Mg$_3$Al$_2$Si$_2$O$_{10}$:Tb, Na(Mg$_{2-x}$Mn$_x$)LiSi$_4$O$_{10}$F$_2$:Mn, NaYF$_4$:Er$^{3+}$, Yb$^{3+}$, NaYO$_2$: Eu$^{3+}$, P46(70%)+P47 (30%), SrAl$_{12}$O$_{19}$:Ce$^{3+}$, Mn$^{2+}$, SrAl$_2$O$_4$:Eu$^{2+}$, SrAl$_4$O$_7$:Eu$^{3+}$, SrAl$_{12}$O$_{19}$:Eu$^{2+}$, SrAl$_2$S$_4$: Eu$^{2+}$, Sr$_2$B$_5$O$_9$Cl:Eu$^{2+}$, SrB$_4$O$_7$:Eu$^{2+}$(F,Cl,Br), SrB$_4$O$_7$: Pb$^{2+}$, SrB$_4$O$_7$:Pb$^{2+}$, Mn$^{2+}$, SrB$_8$O$_{13}$:Sm$^{2+}$, Sr$_x$Ba$_y$Cl$_z$Al$_2$O$_{4-z/2}$:Mn$^{2+}$, SrBaSiO$_4$:Eu$^{2+}$, Sr(Cl,Br,I)$_2$:Eu$^{2+}$ in SiO$_2$, SrCl$_2$:Eu$^{2+}$ in SiO$_2$, Sr$_5$Cl(PO$_4$)$_3$:Eu, Sr$_w$F$_x$B$_4$O$_{6.5}$:Eu$^{2+}$, Sr$_w$F$_x$B$_y$O$_z$:Eu$^{2+}$, Sm$^{2+}$, SrF$_2$:Eu$^{2+}$, SrGa$_{12}$O$_{19}$:Mn$^{2+}$, SrGa$_2$S$_4$: Ce$^{3+}$, SrGa$_2$S$_4$:Eu$^{2+}$, SrGa$_2$S$_4$:Pb$^{2+}$, SrIn$_2$O$_4$:Pr$^{3+}$, Al$^{3+}$, (Sr, Mg)$_3$(PO$_4$)$_2$:Sn, SrMgSi$_2$O$_6$:Eu$^{2+}$, Sr$_2$MgSi$_2$O$_7$:Eu$^{2+}$, Sr$_3$MgSi$_2$O$_8$:Eu$^{2+}$, SrMoO$_4$:U, SrO.3B$_2$O$_3$:Eu$^{2+}$, Cl, β-SrO.3B$_2$O$_3$:Pb$^{2+}$, β-SrO.3B$_2$O$_3$:Pb$^{2+}$, Mn$^{2+}$, α-SrO.3B$_2$O$_3$:Sm$^{2+}$, Sr$_6$P$_5$BO$_{20}$:Eu, Sr$_5$(PO$_4$)$_3$Cl:Eu$^{2+}$, Sr$_5$(PO$_4$)$_3$Cl:Eu$^{2+}$, Pr$^{3+}$, Sr$_5$(PO$_4$)$_3$Cl:Mn$^{2+}$, Sr$_5$(PO$_4$)$_3$Cl:Sb$^{3+}$, Sr$_2$P$_2$O$_7$:Eu$^{2+}$, β-Sr$_3$(PO$_4$)$_2$:Eu$^{2+}$, Sr$_5$(PO$_4$)$_3$F:Mn$^{2+}$, Sr$_5$(PO$_4$)$_3$F:Sb$^{3+}$, Sr$_5$(PO$_4$)$_3$F:Sb$^{3+}$, Mn$^{2+}$, Sr$_5$(PO$_4$)$_3$F:Sn$^{2+}$, Sr$_2$P$_2$O$_7$:Sn$^{2+}$, β-Sr$_3$(PO$_4$)$_2$:Sn$^{2+}$, β-Sr$_3$(PO$_4$)$_2$:Sn$^{2+}$, Mn$^{2+}$ (Al), SrS:Ce$^{3+}$, SrS:Eu$^{2+}$, SrS:Mn$^{2+}$, SrS:Cu$^+$, Na, SrSO$_4$:Bi, SrSO$_4$:Ce$^{3+}$, SrSO$_4$:Eu$^{2+}$, SrSO$_4$:Eu$^{2+}$, Mn$^{2+}$, Sr$_5$Si$_4$O$_{10}$Cl$_6$: Eu$^{2+}$, Sr$_2$SiO$_4$:Eu$^{2+}$, SrTiO$_3$:Pr$^{3+}$, SrTiO$_3$:Pr$^{3+}$, Al$^{3+}$, Sr$_3$WO$_6$:U, SrY$_2$O$_3$:Eu$^{3+}$, ThO$_2$:Eu$^{3+}$, ThO$_2$:Pr$^{3+}$, ThO$_2$: Tb$^{3+}$, YAl$_3$B$_4$O$_{12}$:Bi$^{3+}$, YAl$_3$B$_4$O$_{12}$:Ce$^{3+}$, YAl$_3$B$_4$O$_{12}$:Ce$^{3+}$, Mn, YAl$_3$B$_4$O$_{12}$:Ce$^{3+}$, Tb$^{3+}$, YAl$_3$B$_4$O$_{12}$:Eu$^{3+}$, YAl$_3$B$_4$O$_{12}$: Eu$^{3+}$, Cr$^{3+}$, YAl$_3$B$_4$O$_{12}$:Th$^{4+}$, Ce$^{3+}$, Mn$^{2+}$, YAlO$_3$:Ce$^{3+}$, Y$_3$Al$_5$O$_{12}$:Ce$^{3+}$, Y$_3$Al$_5$O$_{12}$:Cr$^{3+}$, YAlO$_3$:Eu$^{3+}$, Y$_3$Al$_5$O$_{12}$: Eu$^{3r}$, Y$_4$Al$_2$O$_9$:Eu$^{3+}$, Y$_3$Al$_5$O$_{12}$:Mn$^{4+}$, YAlO$_3$:Sm$^{3+}$, YAlO$_3$: Tb$^{3+}$, Y$_3$Al$_5$O$_{12}$:Tb$^{3+}$, YAsO$_4$:Eu$^{3+}$, YBO$_3$:Ce$^{3+}$, YBO$_3$: Eu$^{3+}$, YF$_3$:Er$^{3+}$, Yb$^{3+}$, YF$_3$:Mn$^{2+}$, YF$_3$:Mn$^{2+}$, Th$^{4+}$, YF$_3$: Tm$^{3+}$, Yb$^{3+}$, (Y,Gd)BO$_3$:Eu, (Y,Gd)BO$_3$:Tb, (Y,Gd)$_2$O$_3$: Eu$^{3+}$, Y$_{1.34}$Gd$_{0.60}$O$_3$(Eu,Pr), Y$_2$O$_3$:Bi$^{3+}$, YOBr:Eu$^{3+}$, Y$_2$O$_3$: Ce, Y$_2$O$_3$:Er$^{3+}$, Y$_2$O$_3$:Eu$^{3+}$(YOE), Y$_2$O$_3$:Ce$^{3+}$, Tb$^{3+}$, YOCl: Ce$^{3+}$,YOCl:Eu$^{3+}$,YOF:Eu$^{3+}$,YOF:Tb$^{3+}$,Y$_2$O$_3$:Ho$^{3+}$,Y$_2$O$_2$S: Eu$^{3+}$, Y$_2$O$_2$S:Pr$^{3+}$, Y$_2$O$_2$S:Tb$^{3+}$, Y$_2$O$_3$:Tb$^{3+}$, YPO$_4$:Ce$^{3+}$, YPO$_4$:Ce$^{3+}$, Tb$^{3+}$, YPO$_4$:Eu$^{3+}$, YPO$_4$:Mn$^{2+}$, Th$^{4+}$, YPO$_4$: V$^{5+}$, Y(P,V)O$_4$:Eu, Y$_2$SiO$_5$:Ce$^{3+}$, YTaO$_4$, YTaO$_4$:Nb$^{5+}$, YVO$_4$:Dy$^{3+}$, YVO$_4$:Eu$^{3+}$, ZnAl$_2$O$_4$:Mn$^{2+}$, ZnB$_2$O$_4$:Mn$^{2+}$, ZnBa$_2$S$_3$:Mn$^{2+}$, (Zn,Be)$_2$SiO$_4$:Mn$^{2+}$, Zn$_{0.4}$Cd$_{0.6}$S:Ag, Zn$_{0.6}$Cd$_{0.4}$S:Ag, (Zn,Cd)S:Ag, Cl, (Zn,Cd)S:Cu, ZnF$_2$: Mn$^{2+}$, ZnGa$_2$O$_4$, ZnGa$_2$O$_4$:Mn$^{2+}$, ZnGa$_2$S$_4$:Mn$^{2+}$, Zn$_2$GeO$_4$: Mn$^{2+}$, (Zn,Mg)F$_2$:Mn$^{2+}$, ZnMg$_2$(PO$_4$)$_2$:Mn$^{2+}$, (Zn,Mg)$_3$ (PO$_4$)$_2$:Mn$^{2+}$, ZnO:Al$^{3+}$, Ga$^{3+}$, ZnO:Bi$^{3+}$, ZnO:Ga$^{3+}$, ZnO: Ga, ZnO—CdO:Ga, ZnO:S, ZnO:Se, ZnO:Zn, ZnS:Ag$^+$, Cl$^-$, ZnS:Ag, Cu, Cl, ZnS:Ag, Ni, ZnS:Au, In, ZnS—CdS (25-75), ZnS—CdS (50-50), ZnS—CdS (75-25), ZnS—CdS:Ag, Br, Ni, ZnS—CdS:Ag$^+$, Cl, ZnS—CdS:Cu, Br, ZnS—CdS: Cu, I, ZnS:Cl$^-$, ZnS:Eu$^{2+}$, ZnS:Cu, ZnS:Cu$^+$, Al$^{3+}$, ZnS:Cu$^+$, Cl$^-$, ZnS:Cu, Sn, ZnS:Eu$^{2+}$, ZnS:Mn$^{2+}$, ZnS:Mn, Cu, ZnS: Mn$^{2+}$, Te$^{2+}$, ZnS:P, ZnS:P$^{3-}$, Cl$^-$, ZnS:Pb$^{2+}$, ZnS:Pb$^{2+}$, Cl$^-$, ZnS:Pb, Cu, Zn$_3$(PO$_4$)$_2$:Mn$^{2+}$, Zn$_2$SiO$_4$:Mn$^{2+}$, Zn$_2$SiO$_4$: Mn$^{2+}$, As$^{5+}$, Zn$_2$SiO$_4$:Mn, Sb$_2$O$_2$, Zn$_2$SiO$_4$:Mn$^{2+}$, P, Zn$_2$SiO$_4$:Ti$^{4+}$, ZnS:Sn$^{2+}$, ZnS:Sn, Ag, ZnS:Sn$^{2+}$, Li$^+$, ZnS: Te, Mn, ZnS—ZnTe:Mn$^{2+}$, ZnSe:Cu$^+$, Cl, ZnWO$_4$

The following examples are intended to illustrate the present invention. However, they should in no way be regarded as limiting. All compounds or components which can be used in the compositions are either known and commercially available or can be synthesised by known methods. The temperatures indicated in the examples are always given in ° C. It furthermore goes without saying that, both in the description and also in the examples, the added amounts of the components in the compositions always add up to a total of 100%. Percentage data given should always be regarded in the given connection. However, they usually always relate to the weight of the part-amount or total amount indicated.

EXAMPLES

1. Preparation of co-doped $Ca_2Si_5N_8$:Eu (Comprising 2% and 10% of Eu)

Example 1a

Preparation of $Ca_2Si_5N_8$:Eu(2%) as Reference Phosphor 2.8730 g of $CaH_2$ (Alfa Aesar 99.8%), 0.2479 g of $EuF_3$ (ChemPur 99.9%) and 6.9356 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2$=90/10) and, after the furnace has been closed, calcined at 1400° C. for 14 h. Finally, the resultant sinter cake is ground, sieved and classified.

Example 1b

Preparation of $Ca_2Si_5N_8$:Eu(2%) Co-Doped with 0.1% of Hf 2.4428 g of $CaH_2$ (Alfa Aesar 99.8%), 0.2477 g of $EuF_3$ (ChemPur 99.9%), 0.0151 g of $HfF_4$ (Alfa Aesar 99.9%) and 6.9299 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2$=90/10) and, after the furnace has been closed, calcined at 1400° C. for 14 h. Finally, the resultant sinter cake is ground, sieved and classified.

Example 1c

Preparation of $Ca_2Si_5N_8$:Eu(2%) Co-Doped with 0.1% of Zr 2.4441 g of $CaH_2$ (Alfa Aesar 99.8%), 0.2479 g of $EuF_3$ (ChemPur 99.9%), 0.0099 g of $ZrF_4$ (Alfa Aesar 98%) and 6.9335 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2$=90/10) and, after the furnace has been closed, calcined at 1400° C. for 14 h. Finally, the resultant sinter cake is ground, sieved and classified.

Example 1d

Preparation of $Ca_2Si_5N_8$:Eu(10%) as Reference Phosphor 2.1342 g of $CaH_2$ (Alfa Aesar 99.8%), 1.1772 g of $EuF_3$ (ChemPur 99.9%) and 6.5858 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2$=90/10) and, after the furnace has been closed, calcined at 1400° C. for 14 h. Finally, the resultant sinter cake is ground, sieved and classified.

Example 1e

Preparation of $Ca_2Si_5N_8$:$Eu^{2+}$ (10%) Co-Doped with 0.1% of Hf 2.1302 g of $CaH_2$ (Alfa Aesar 99.8%), 1.1762 g of $EuF_3$ (ChemPur 99.9%), 0.0143 g of $HfF_4$ (Alfa Aesar 99.9%) and 6.5807 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2$=90/10) and, after the furnace has been closed, calcined at 1400° C. for 14 h. Finally, the resultant sinter cake is ground, sieved and classified.

Example 1f

Preparation of $Ca_2Si_5N_8$:$Eu^{2+}$ (10%) Co-Doped with 0.1% of Zr 2.1312 g of $CaH_2$ (Alfa Aesar 99.8%), 1.1768 g of $EuF_3$ (ChemPur 99.9%), 0.0094 g of $ZrF_4$ (Alfa Aesar 99.9%) and 6.5839 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2$=90/10) and, after the furnace has been closed, calcined at 1400° C. for 14 h. Finally, the resultant sinter cake is ground, sieved and classified.

2. Preparation of Co-Doped $Sr_2Si_5N_8$:Eu (Comprising 2% of Eu)

Example 2a

Preparation of $Sr_2Si_5N_8$:Eu(2%) as Reference Phosphor 4.4164 g of $Sr_3N_2$, 0.1942 g of $EuF_3$ (ChemPur 99.9%) and 5.4337 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2$=90/10) and, after the furnace has been closed, calcined at 1400° C. for 14 h. Finally, the resultant sinter cake is ground, sieved and classified.

Example 2b

Preparation of $Sr_2Si_5N_8$:Eu(2%) Co-Doped with 0.1% of Hf 4.4100 g of $Sr_3N_2$, 0.1942 g of $EuF_3$ (ChemPur 99.9%), 0.0118 g of $HfF_4$ (Alfa Aesar 99.9%) and 5.4314 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2=90/10$) and, after the furnace has been closed, calcined at 1400° C. for 14 h. Finally, the resultant sinter cake is ground, sieved and classified.

Example 2c

Preparation of $Sr_2Si_5N_8$:Eu(2%) Co-Doped with 0.1% of Zr 4.4118 g of $Sr_3N_2$, 0.1942 g of $EuF_3$ (ChemPur 99.9%), 0.0078 g of $ZrF_4$ (Alfa Aesar 99.9%) and 5.4336 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2=90/10$) and, after the furnace has been closed, calcined at 1400° C. for 14 h. Finally, the resultant sinter cake is ground, sieved and classified.

3. Preparation of Co-Doped $Ba_2Si_5N_8$:Eu (Comprising 2% of Eu)

Example 3a

Preparation of $Ba_2Si_5N_8$:Eu(2%) as Reference Phosphor 5.4472 g of $Ba_3N_2$, 0.1584 g of $EuF_3$ (ChemPur 99.9%) and 4.4305 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2=90/10$) and, after the furnace has been closed, calcined at 1400° C. for 14 h. Finally, the resultant sinter cake is ground, sieved and classified.

Example 3b

Preparation of $Ba_2Si_5N_8$:Eu(2%) Co-Doped with 0.1% of Hf 5.4408 g of $Ba_3N_2$, 0.1584 g of $EuF_3$ (ChemPur 99.9%), 0.0096 g of $HfF_4$ (Alfa Aesar 99.9%) and 4.4298 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2=90/10$) and, after the furnace has been closed, calcined at 1400° C. for 14 h. Finally, the resultant sinter cake is ground, sieved and classified.

Example 3c

Preparation of $Ba_2Si_5N_8$:Eu(2%) Co-Doped with 0.1% of Zr 5.4426 g of $Ba_3N_2$, 0.1584 g of $EuF_3$ (ChemPur 99.9%), 0.0063 g of $ZrF_4$ (Alfa Aesar 99.9%) and 4.4313 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2=90/10$) and, after the furnace has been closed, calcined at 1400° C. for 14 h. Finally, the resultant sinter cake is ground, sieved and classified.

Example 4

Preparation of $Na_2Ca_{0.98}Zr_{0.001}Si_{4.999}N_8$:$Eu_{0.02}$ (Comprising 2% of Eu) Co-Doped with 0.1% of Zr 0.81469 g of $CaH_2$ (Alfa Aesar 99.8%), 0.9288 g of NaH (95%, Sigma Aldrich), 0.2479 g of $EuF_3$ (ChemPur 99.9%), 0.0099 g of $ZrF_4$ (Alfa Aesar 98%) and 6.9335 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2=90/10$) and, after the furnace has been closed, calcined at 1400° C. for 14 h. Finally, the resultant sinter cake is ground, sieved and classified.

Example 5

Preparation of $Na_{1.99}Ca_{0.97}Zr_{0.001}Si_{4.999}N_8$: $Eu_{0.02}Ce_{0.01}$ (Comprising 2% of Eu and 1% of Ce) Co-Doped with 0.1% of Zr 0.7897 g of $CaH_2$ (Alfa Aesar 99.8%), 0.9146 g of NaH (95%, Sigma Aldrich), 0.2479 g of $EuF_3$ (ChemPur 99.9%), 0.1169 g of CeF3 (Chempur 99.9%), 0.0099 g of $ZrF_4$ (Alfa Aesar 98%) and 6.9335 g of $Si_3N_4$ (UBE 99.99%) are mixed intimately with one another in a glove box with exclusion of oxygen and moisture and subsequently transferred into a corundum crucible lined with molybdenum. The crucible is then transferred into a tubular furnace flushed with forming gas ($N_2/H_2=90/10$) and, after the furnace has been closed, calcined at 1400° C. for 14 h. Finally, the resultant sinter cake is ground, sieved and classified.

TABLE 1

Optical properties of $M_{1.98}Si_5N_8$:$Eu_{0.02}$ (M = Ca, Sr, Ba) compared with the co-doped phosphor according to the invention (QY = quantum yield)

| Composition | Emission max. at [nm] | QY at 450 nm [%] | CIE1931 x, y |
|---|---|---|---|
| $Ca_2Si_5N_8$:$Eu^{2+}$(2.0%) | 609 | 79 | 0.601 0.397 |
| $Ca_2Si_5N_8$:$Eu^{2+}$(2.0%), $Hf^{4+}$(0.1%) | 608 | 84 | 0.600 0.399 |
| $Ca_2Si_5N_8$:$Eu^{2+}$(2.0%), $Zr^{4+}$(0.1%) | 608 | 86 | 0.600 0.398 |
| $Sr_2Si_5N_8$:$Eu^{2+}$(2.0%) | 619 | 71 | 0.629 0.369 |
| $Sr_2Si_5N_8$:$Eu^{2+}$(2.0%), $Hf^{4+}$(0.1%) | 617 | 87 | 0.621 0.372 |
| $Sr_2Si_5N_8$:$Eu^{2+}$(2.0%), $Zr^{4+}$(0.1%) | 617 | 80 | 0.629 0.376 |
| $Ba_2Si_5N_8$:$Eu^{2+}$(2.0%) | 583 | 76 | 0.540 0.458 |
| $Ba_2Si_5N_8$:$Eu^{2+}$(2.0%), $Hf^{4+}$(0.1%) | 581 | 84 | 0.535 0.462 |
| $Ba_2Si_5N_8$:$Eu^{2+}$(2.0%), $Zr^{4+}$(0.1%) | 581 | 88 | 0.532 0.466 |

DESCRIPTION OF THE FIGURES

The invention will be explained in greater detail below with reference to a number of working examples, in which.

Figure 1:
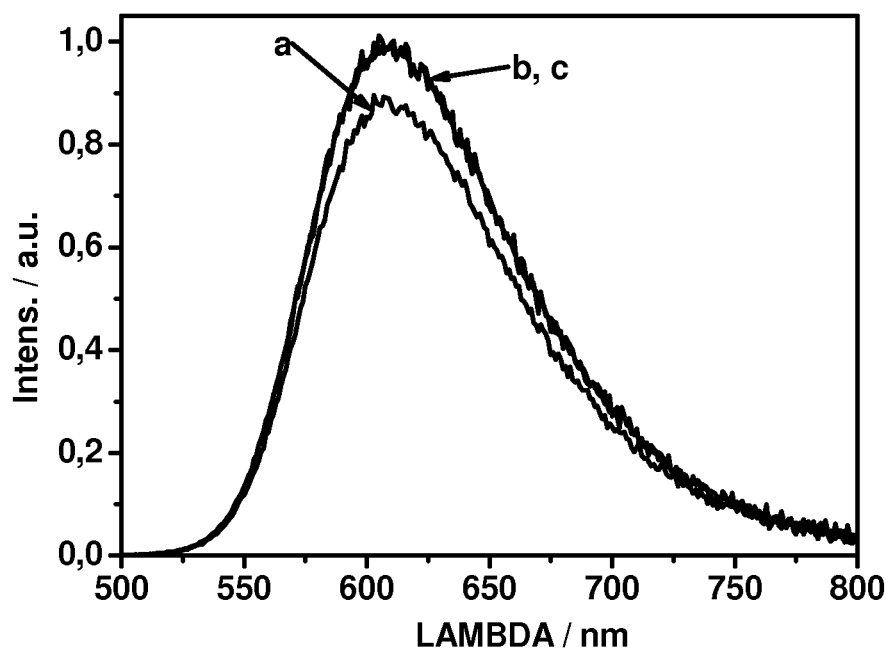
FIG. 1: shows the emission spectrum of $Ca_{1.98}Si_5N_8:Eu_{0.02}$ and co-doped phosphor at an excitation wavelength of 450 nm. Here,
a) denotes the non-co-doped phosphor
b) denotes $Ca_{1.98}Si_5N_8:Eu_{0.02}$ co-doped with 0.1% of Zr and
c) denotes $Ca_{1.98}Si_5N_8:Eu_{0.02}$ co-doped with 0.1% of Hf.
Figure 2:
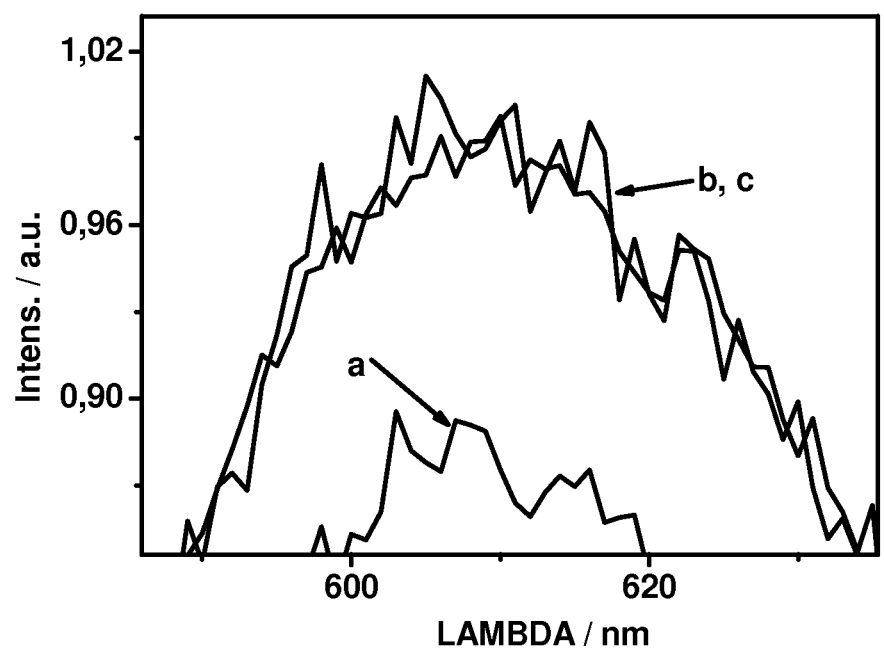
FIG. 2: shows a detail enlargement from FIG. 1 for better differentiation. The emission spectra of b) and c) are approximately identical.
Figure 3:
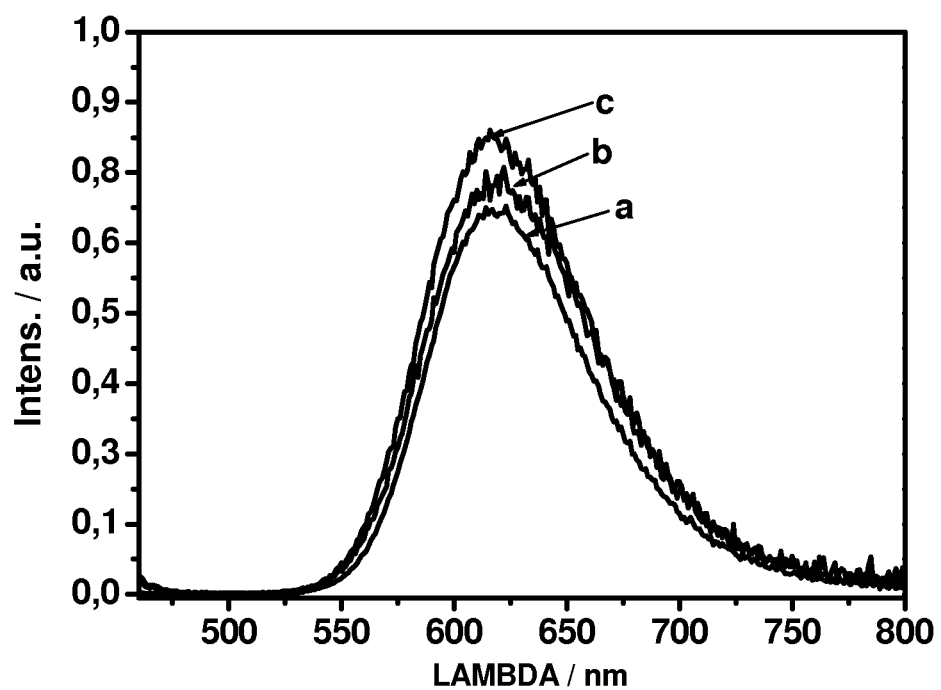
FIG. 3: shows the emission spectrum of $Sr_{1.98}Si_5N_8:Eu_{0.02}$ and co-doped phosphor at an excitation wavelength of 450 nm. Here,
a) denotes the non-co-doped phosphor
b) denotes $Sr_{1.98}Si_5N_8:Eu_{0.02}$ co-doped with 0.1% of Zr and
c) denotes $Sr_{1.98}Si_5N_8:Eu_{0.02}$ co-doped with 0.1% of Hf.
Figure 4:
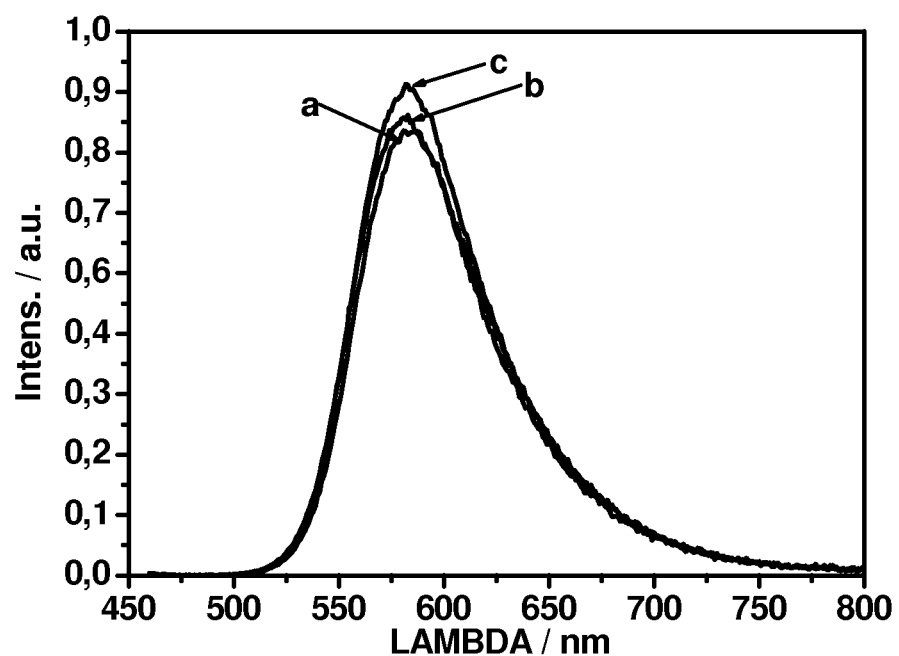
FIG. 4: shows the emission spectrum of $Ba_{1.98}Si_5N_8:Eu_{0.02}$ and co-doped phosphor according to the invention at an excitation wavelength of 450 nm.
a) denotes the non-co-doped phosphor, b) denotes $Ba_{1.98}Si_5N_8:Eu_{0.02}$ co-doped with 0.1% of Zr c) denotes $Ba_{1.98}Si_5N_8:Eu_{0.02}$ co-doped with 0.1% of Hf.
Figure 5:
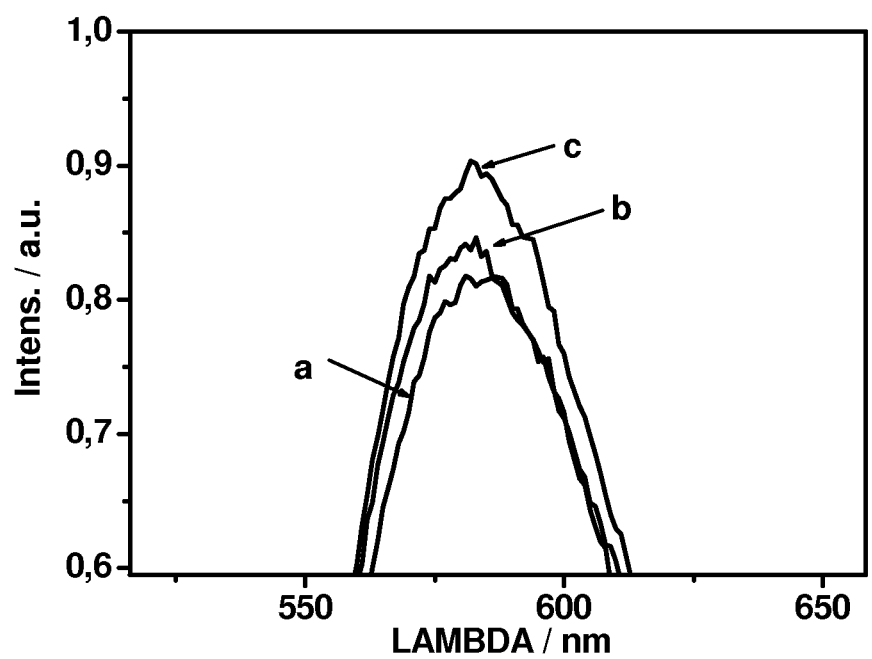
FIG. 5: shows a detail enlargement from FIG. 4 for better differentiation of the emission spectra.
Figure 6:
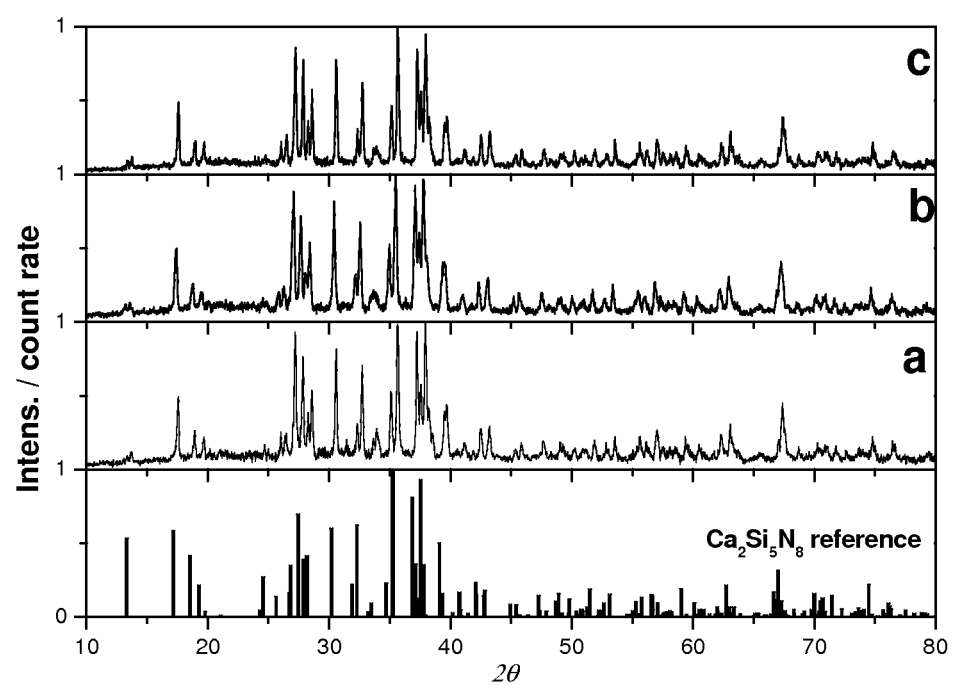
FIG. 6: shows X-ray powder diffraction patterns of a) the non-co-doped phosphor b) $Ca_{1.98}Si_5N_8:Eu_{0.02}$ co-doped with 0.1% of Zr c) $Ca_{1.98}Si_5N_8:Eu_{0.02}$ co-doped with 0.1% of Hf.
Figure 7:
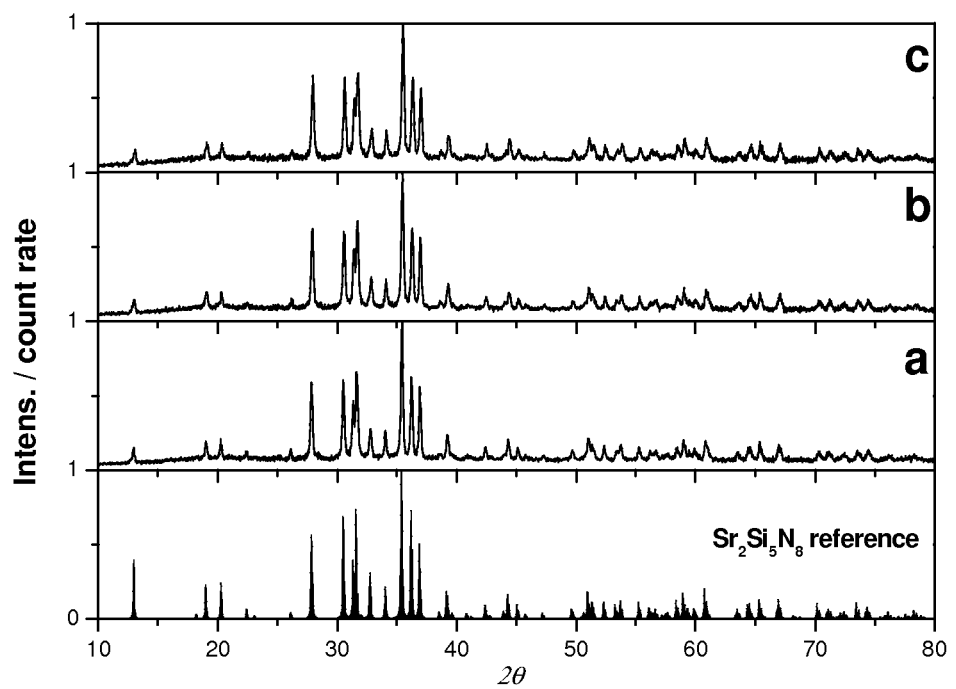
FIG. 7: shows X-ray powder diffraction patterns of a) the non-co-doped phosphor b) $Sr_{1.98}Si_5N_8:Eu_{0.02}$ co-doped with 0.1% of Zr c) $Sr_{1.98}Si_5N_8:Eu_{0.02}$ co-doped with 0.1% of Hf.
Figure 8:
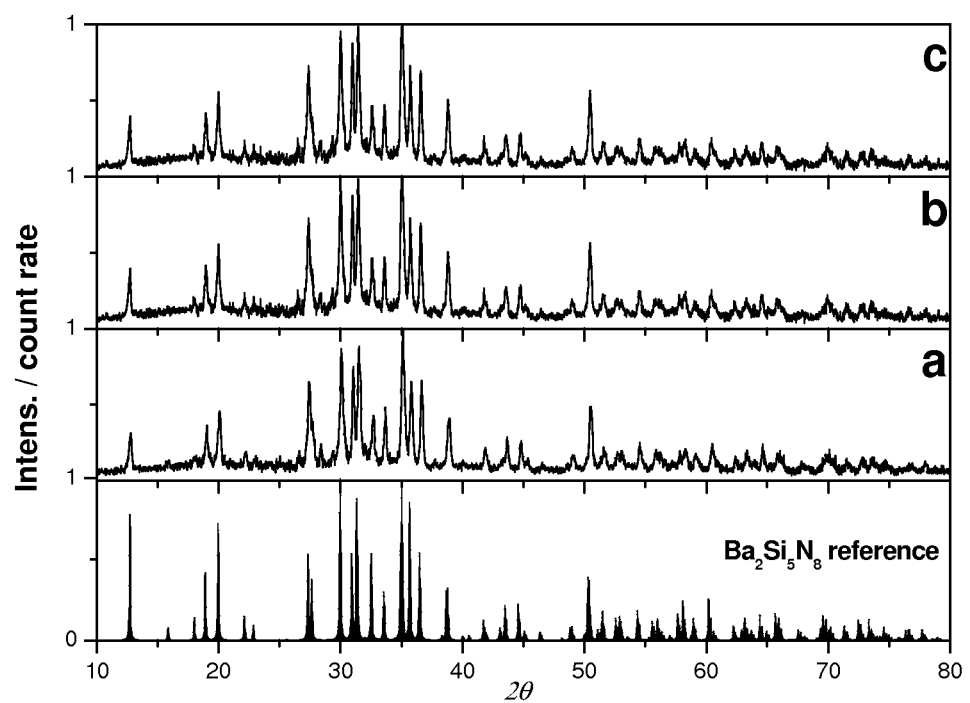
FIG. 8: shows X-ray powder diffraction patterns of a) the non-co-doped phosphor b) $Ba_{1.98}Si_5N_8:Eu_{0.02}$ co-doped with 0.1% of Zr c) $Ba_{1.98}Si_5N_8:Eu_{0.02}$ co-doped with 0.1% of Hf.
Figure 9:
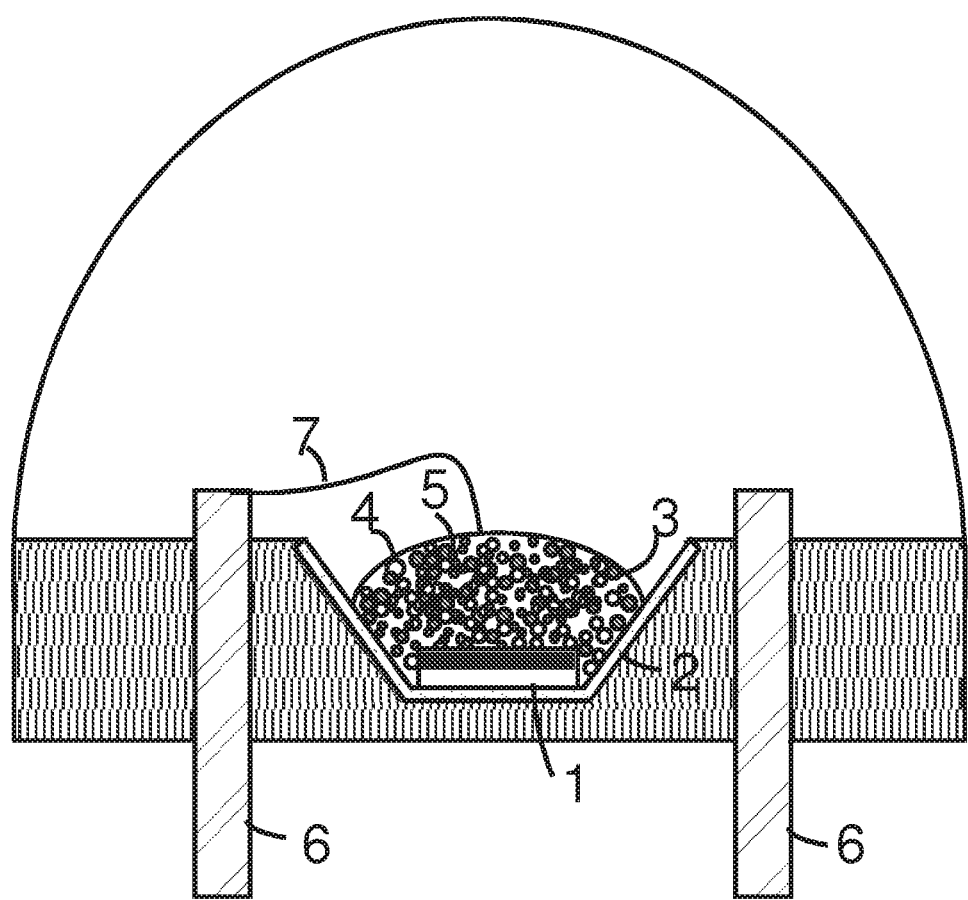
FIG. 9: shows a diagrammatic depiction of a light-emitting diode having a phosphor-containing coating. The component comprises a chip-like LED 1 as radiation source. The LED is mounted in a cup-shaped reflector, which is held by an adjustment frame 2. The chip 1 is connected to a first contact 6 via a flat cable 7 and directly to a second electrical contact 6'. A coating which comprises a conversion phosphor according to the invention has been applied to the inside curvature of the reflector cup. The phosphors are employed either separately from one another or as a mixture. (List of part numbers: 1 light-emitting diode, 2 reflector, 3 resin, 4 conversion phosphor, 5 diffuser, 6 electrodes, 7 flat cable)
Figure 10:
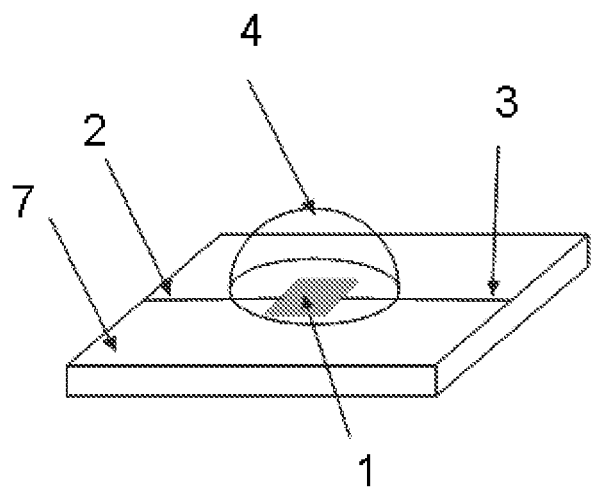
FIG. 10: shows a COB (chip on board) package of the InGaN type, which serves as light source (LED) for white light (1=semiconductor chip; 2, 3=electrical connections; 4=conversion phosphor; 7=board). The phosphor is distributed in a binder lens, which simultaneously represents a secondary optical element and influences the light emission characteristics as a lens.
Figure 11:
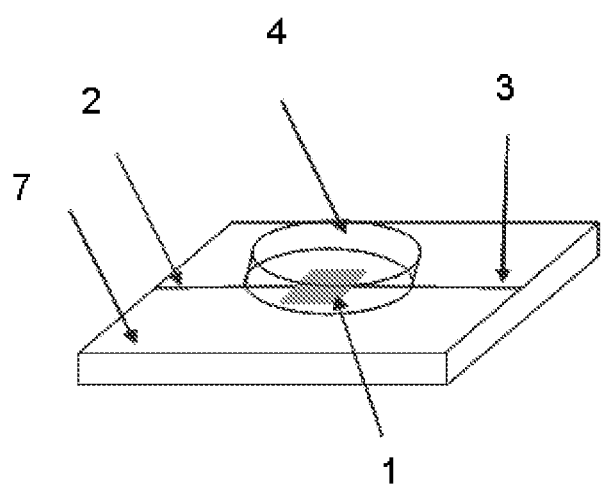
FIG. 11: shows a COB (chip on board) package of the InGaN type, which serves as light source (LED) for white light (1=semiconductor chip; 2, 3=electrical connections; 4=conversion phosphor; 7=board). The phosphor is located in a thin binder layer distributed directly on the LED chip. A secondary optical element consisting of a transparent material can be placed thereon.
Figure 12:
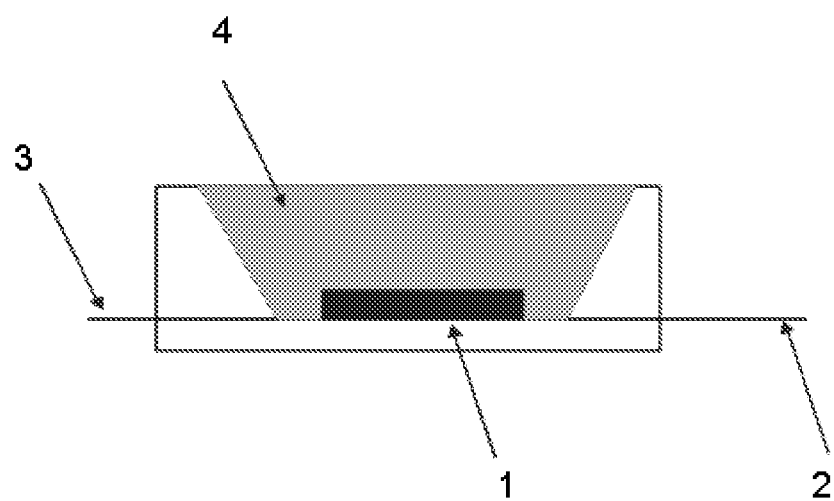
FIG. 12: shows a package which serves as light source (LED) for white light (1=semiconductor chip; 2, 3=electrical connections; 4=conversion phosphor in cavity with reflector). The conversion phosphor is dispersed in a binder, with the mixture filling the cavity.
Figure 13:
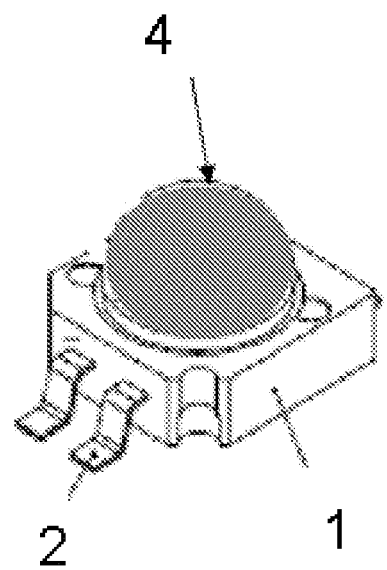
FIG. 13: shows a package, where 1=casing; 2=electrical connection; 4=semiconductor chip, and the cavity beneath the lens is completely filled with the conversion phosphor according to the invention. This package has the advantage that a larger amount of conversion phosphor can be used. This can also act as remote phosphor.
Figure 14:
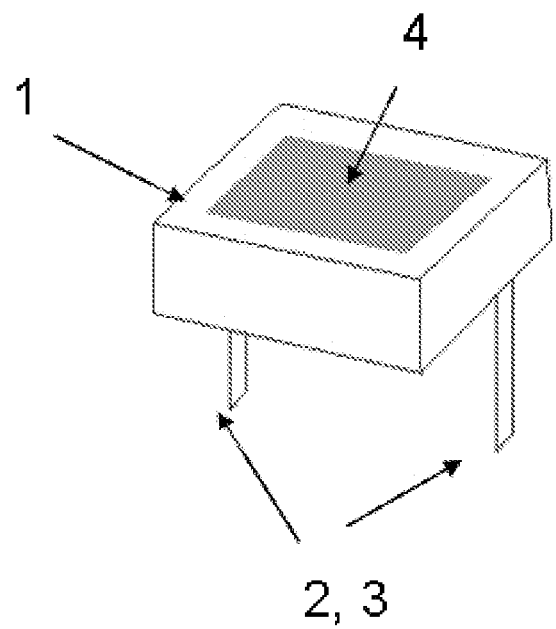
FIG. 14: shows an SMD package (surface mounted package), where 1=casing; 2, 3=electrical connections, 4=conversion layer. The semiconductor chip is completely covered by the phosphor according to the invention. The SMD design has the advantage that it has a small physical shape and thus fits into conventional lamps.
Figure 15:
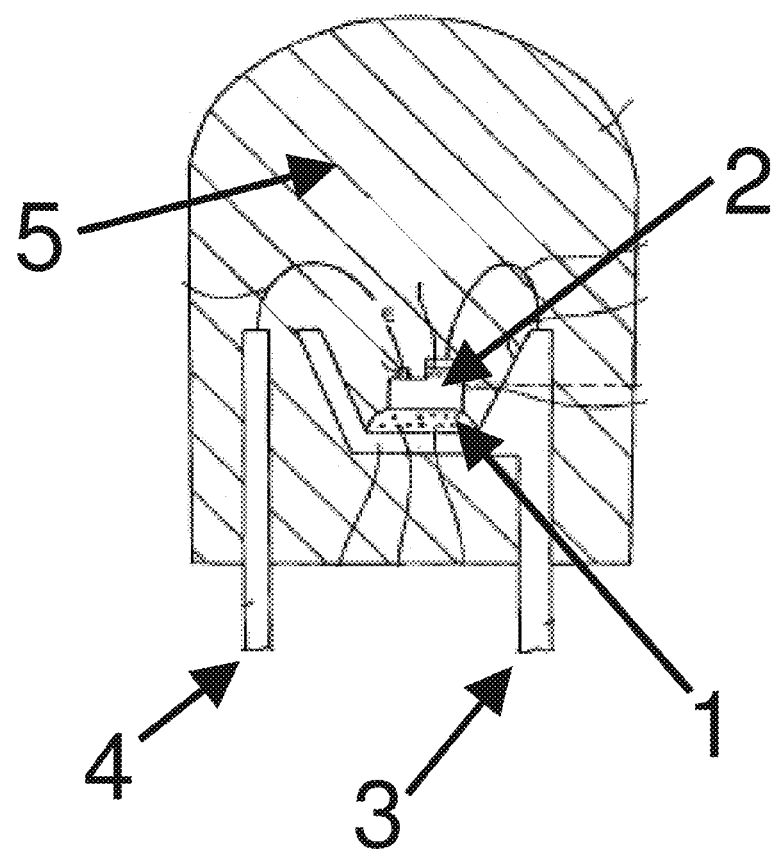
FIG. 15: shows a T5 package, where 1=conversion phosphor; 2=chip; 3, 4=electrical connections; 5=lens with transparent resin. The conversion phosphor is located on the back of the LED chip, which has the advantage that the phosphor is cooled via the metallic connections.
Figure 16:
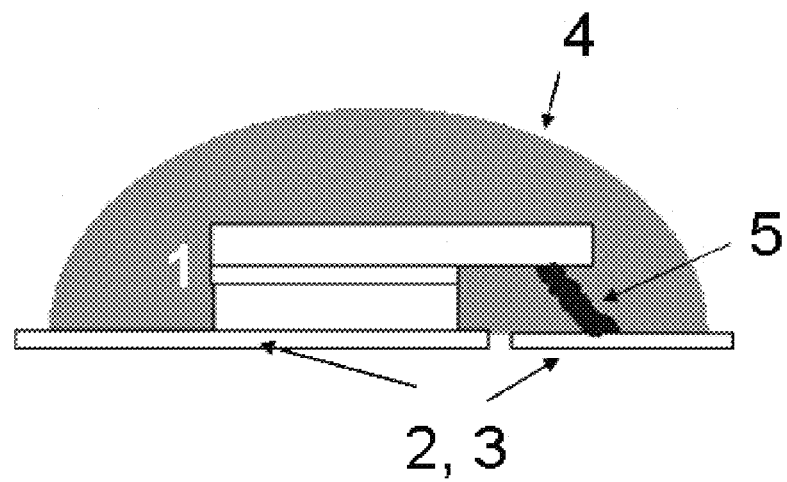
FIG. 16: shows a diagrammatic depiction of a light-emitting diode where 1=semiconductor chip; 2, 3=electrical connections; 4=conversion phosphor; 5=bond wire, where the phosphor is applied in a binder as top globe. This form of the phosphor/binder layer can act as secondary optical element and influence, for example, light propagation.
Figure 17:
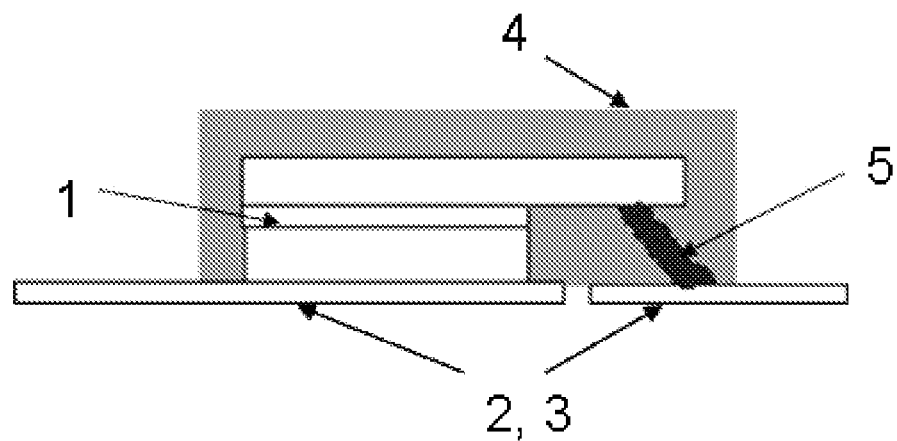
FIG. 17: shows a diagrammatic depiction of a light-emitting diode where 1=semiconductor chip; 2, 3=electrical connections; 4=conversion phosphor; 5=bond wire, where the phosphor is applied as a thin layer dispersed in a binder. A further component acting as secondary optical element, such as, for example, a lens, can easily be applied to this layer.
Figure 18:
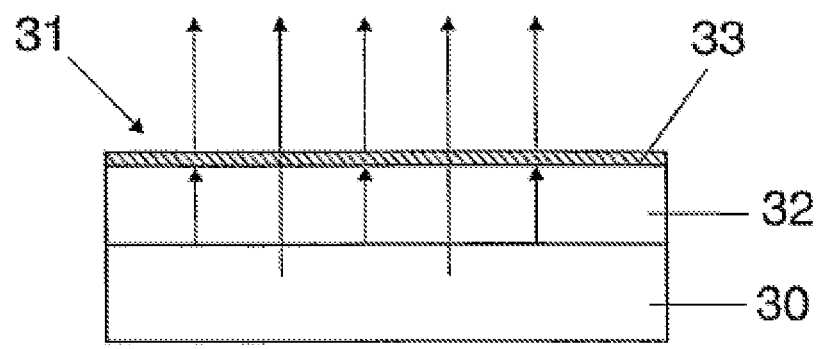
FIG. 18: shows an example of a further application, as is already known in principle from U.S. Pat. No. 6,700,322. The phosphor according to the invention is used here together with an OLED. The light source is an organic light-emitting diode 31, consisting of the actual organic film 30 and a transparent substrate 32. The film 30 emits, in particular, blue primary light, generated, for example, by means of PVK: PBD:coumarine (PVK, abbreviation for poly-(N-vinylcarbazole); PBD, abbreviation for 2-(4-biphenyl)-5-(4-tert-butylphenyl)-1,3,4-oxadiazole)). The emission is partially converted into yellow, secondarily emitted light by a cover layer formed from a layer 33 of the phosphor according to the invention, so that white emission is achieved overall through colour mixing of the primarily and secondarily emitted light. The OLED essentially consists of at least one layer of a light-emitting polymer or of so-called small molecules between two electrodes, which consist of materials known per se, such as, for example, ITO (abbreviation for indium tin oxide), as anode and a highly reactive metal, such as, for example, Ba or Ca, as cathode. A plurality of layers is also often used between the electrodes, which either serve as hole-transport layer or, in the area of small molecules, also as electron-transport layers. The emitting polymers used are, for example, polyfluorenes or polyspiro materials.

The invention claimed is:

1. A compound of formula I

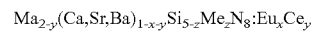  (I)

where
Ma=at least one of Li, Na and K
Me=at least one of $Hf^{4+}$ and $Zr^{4+}$
x=0.0015 to 0.20
y=0 to 0.15 and
z<4.

2. A compound according to claim 1, wherein z<1.

3. A compound of according to 1, which is obtainable by mixing a material containing silicon nitride, europium, cerium and at least one of calcium, strontium and barium with at least one co-dopant containing at least one of hafnium, zirconium, lithium, sodium and potassium by a solid-state diffusion method with subsequent thermal aftertreatment.

4. A process for preparing a compound according to claim 1, comprising
   a) preparation of a 2-5-8 alkaline-earth metal siliconitride compound doped with at least one of europium and cerium and co-doped with a material containing at least one of hafnium, zirconium, lithium, sodium and potassium by mixing at least 4 starting materials selected from materials containing at least one of silicon nitride, europium, cerium, calcium, strontium, barium, hafnium, zirconium, lithium, sodium and potassium
   b) thermal aftertreatment of the co-doped compound.

5. A shaped body comprising a compound of the 2-5-8 alkaline-earth metal siliconitride type with at least one of europium and cerium doping which additionally comprises at least one of hafnium, zirconium, lithium, sodium and potassium as co-dopants, and which
   A) has a rough surface which carries nanoparticles comprising at least one of $SiO_2$, $TiO_2$, $Al_2O_3$, ZnO, $ZrO_2$ and $Y_2O_3$ or mixed oxides thereof or particles comprising a compound of the 2-5-8 alkaline-earth metal siliconitride type with or without one or more dopants from the series europium, cerium, hafnium, zirconium, lithium, sodium and potassium or particles comprising a compound of formula I $$Ma_{2-y}(Ca,Sr,Ba)_{1-x-y}Si_{5-z}Me_zN_8:Eu_xCe_y \quad (I)$$

where
   Ma=at least one of Li, Na and K
   Me=at least one of $Hf^{4+}$ and $Zr^{4+}$
   x=0.0015 to 0.20
   y=0 to 0.15 and
   z<4;
   or
   B) has a continuous surface coating which consists of at least one of $SiO_2$, $TiO_2$, $Al_2O_3$, ZnO, $ZrO_2$ and $Y_2O_3$ or mixed oxides thereof or a compound of the 2-5-8 alkaline-earth metal siliconitride type with cerium doping which additionally comprises at least one of hafnium, zirconium, lithium, sodium and potassium as co-dopants, and which is without the activator europium;
   or
   C) has a porous surface coating which consists of at least one of $SiO_2$, $TiO_2$, $Al_2O_3$, ZnO, $ZrO_2$ and $Y_2O_3$ or mixed oxides thereof or of a compound of the 2-5-8 alkaline-earth metal siliconitride type with or without one or more dopants from the series europium, cerium, hafnium, zirconium, lithium, sodium and potassium or a compound of formula I $$Ma_{2-y}(Ca,Sr,Ba)_{1-x-y}Si_{5-z}Me_zN_8:Eu_xCe_y \quad (I)$$

where
   Ma=at least one of Li, Na and K
   Me=at least one of $Hf^{4+}$ and $Zr^{4+}$
   x=0.0015 to 0.20
   y=0 to 0.15 and
   z<4.

6. A shaped body comprising a compound according to claim 5, which A) has a rough surface which carries nanoparticles comprising at least one of $SiO_2$, $TiO_2$, $Al_2O_3$, ZnO, $ZrO_2$ and $Y_2O_3$ or mixed oxides thereof or particles comprising a compound of the 2-5-8 alkaline-earth metal siliconitride type with or without one or more dopants from the series europium, cerium, hafnium, zirconium, lithium, sodium and potassium or particles comprising a compound of formula I $$Ma_{2-y}(Ca,Sr,Ba)_{1-x-y}Si_{5-z}Me_zN_8:Eu_xCe_y \quad (I)$$

where
   Ma=at least one of Li, Na and K
   Me=at least one of $Hf^{4+}$ and $Zr^{4+}$
   x=0.0015 to 0.20
   y=0 to 0.15 and
   z<4,
   or a combination thereof.

7. A shaped body comprising a compound according to claim 5, which B) has a continuous surface coating which consists of at least one of $SiO_2$, $TiO_2$, $Al_2O_3$, ZnO, $ZrO_2$ and $Y_2O_3$ or mixed oxides thereof or of a compound of the 2-5-8 alkaline-earth metal siliconitride type with cerium doping which additionally comprises at least one of hafnium, zirconium, lithium, sodium and potassium as co-dopants, and which is without the activator europium.

8. A shaped body comprising a compound according to claim 5, which C) has a porous surface coating which consists of at least one of $SiO_2$, $TiO_2$, $Al_2O_3$, ZnO, $ZrO_2$ and $Y_2O_3$ or mixed oxides thereof or of a compound of the 2-5-8 alkaline-earth metal siliconitride type with or without one or more of the dopants from the series europium, cerium, hafnium, zirconium, lithium, sodium and potassium or a compound of formula I $$Ma_{2-y}(Ca,Sr,Ba)_{1-x-y}Si_{5-z}Me_zN_8:Eu_xCe_y \quad (I)$$

where
   Ma=at least one of Li, Na and K
   Me=at least one of $Hf^{4+}$ and $Zr^{4+}$
   x=0.0015 to 0.20
   y=0 to 0.15 and
   z<4.

9. A shaped body comprising a compound of the 2-5-8 alkaline-earth metal siliconitride type with at least one of europium and cerium doping which additionally comprises at least one of hafnium, zirconium, lithium, sodium and potassium as co-dopants, wherein at least one of the co-dopants is hafnium or zirconium, whose surface carries functional groups which facilitate chemical or physical bonding to the environment.

10. A process for the production of a shaped body according to claim 6, comprising
    a) preparation of a 2-5-8 europium-doped alkaline-earth metal siliconitride compound co-doped with a material containing at least one of hafnium and zirconium by mixing at least 4 starting materials selected from materials containing at least one of silicon nitride, europium, cerium, calcium, strontium, barium, hafnium, zirconium, lithium, sodium and potassium,
    b) thermal aftertreatment of the co-doped compound and formation of a shaped body having a rough surface,
    c) coating of the rough surface with nanoparticles comprising at least one of $SiO_2$, $TiO_2$, $Al_2O_3$, ZnO, $ZrO_2$ and $Y_2O_3$ or mixed oxides thereof.

11. A lighting unit having at least one primary light source whose emission maximum is in the range 250 nm to 530 nm, where this radiation is partially or completely converted into longer-wavelength radiation by a compound according to claim 1.

12. A lighting unit according to claim 11, wherein a light source is a luminescent indium aluminium gallium nitride or a luminescent compound based on ZnO, a transparent conducting oxide, ZnSe or SiC.

13. A lighting unit according to claim 11, wherein a light source is an organic light-emitting arrangement or a plasma or discharge lamp.

14. A lighting unit according to claim 11, wherein the phosphor is arranged directly on the primary light source or remote therefrom, or is arranged both directly on the primary light source and remote therefrom.

15. A lighting unit according to claim 11, wherein the optical coupling between the phosphor and the primary light source is achieved by a light-conducting arrangement.

16. A method for partial or complete conversion of blue or UV emission from a luminescent diode, comprising performing said conversion with at least one compound according to claim 1 as a phosphor or conversion phosphor.

17. A method for conversion of primary radiation into a certain colour point in accordance with the colour-on-demand concept, comprising performing said conversion with at least one compound according to claim 1 as a conversion phosphor.

18. A phosphor element, comprising a shaped body according to claim 6.

19. A shaped body according to claim 5, wherein

A) has a rough surface which carries nanoparticles comprising at least one of $SiO_2$, $TiO_2$, $Al_2O_3$, ZnO, $ZrO_2$ and $Y_2O_3$ or mixed oxides thereof;

or

B) has a continuous surface coating which consists of at least one of $SiO_2$, $TiO_2$, $Al_2O_3$, ZnO, $ZrO_2$ and $Y_2O_3$ or mixed oxides thereof;

or

C) has a porous surface coating which consists of at least one of $SiO_2$, $TiO_2$, $Al_2O_3$, ZnO, $ZrO_2$ and $Y_2O_3$ or mixed oxides thereof.

20. A shaped body according to claim 5, which shaped body comprises a compound of the 2-5-8 alkaline-earth metal siliconitride type with at least one of europium and cerium doping which additionally comprises at least one of hafnium, zirconium, lithium, sodium and potassium as co-dopants, wherein at least one of the co-dopants is hafnium or zirconium.

21. A compound according to claim 1, wherein $z=0.0002$ to $0.02$.

* * * * *